US008194868B2

(12) United States Patent
Horbach et al.

(10) Patent No.: US 8,194,868 B2
(45) Date of Patent: Jun. 5, 2012

(54) LOUDSPEAKER SYSTEM FOR VIRTUAL SOUND SYNTHESIS

(75) Inventors: Ulrich Horbach, Agoura Hills, CA (US); Etienne Corteel, Paris (FR)

(73) Assignee: Harman International Industries, Incorporated, Northridge, CA (US)

( * ) Notice: Subject to any disclaimer, the term of this patent is extended or adjusted under 35 U.S.C. 154(b) by 1158 days.

(21) Appl. No.: 11/969,149

(22) Filed: Jan. 3, 2008

(65) Prior Publication Data

US 2008/0101620 A1 May 1, 2008

Related U.S. Application Data

(62) Division of application No. 10/434,448, filed on May 8, 2003, now Pat. No. 7,336,793.

(51) Int. Cl.

*H04R 29/00* (2006.01)
*H04R 25/00* (2006.01)
*H03G 5/00* (2006.01)
*H03B 29/00* (2006.01)

(52) U.S. Cl. .............. 381/59; 381/56; 381/58; 381/152; 381/103; 381/71.2

(58) Field of Classification Search .................... 381/59, 381/56–58, 152, 182, 17–19, 103, 107
See application file for complete search history.

(56) References Cited

U.S. PATENT DOCUMENTS 6,959,096 B2 10/2005 Boone et al.
7,116,790 B2 10/2006 Heron et al.
7,536,018 B2 * 5/2009 Onishi et al. ................. 381/71.8
7,804,963 B2 * 9/2010 Thomas et al. ............ 381/71.12

FOREIGN PATENT DOCUMENTS

EP 1 209 949 A1 5/2002

OTHER PUBLICATIONS

Corteel et al. Multichannel Inverse Filtering of Multiexciter Distributed Mode Loudspeakers for Wave Field Synthesis, pp. 1-5. Paper 5611 presented at the 112th Convention, May 10-13, 2002.*
Horbach et al. Real-Time Rending of Dynamic Sceneds using Wave Field Synthesis, pp. 517-520. 2002. IEEE.*
Corteel et al. Multichannel Inverse Filtering of Multiexciter Distributed Mode Loudspeakers for Wave Field Synthesis, pp. 1-5. Paper 5611 presented at the 112 th Convention, May 10-13, 2002.*

(Continued)

*Primary Examiner* — Devona Faulk

(57) ABSTRACT

A sound system obtains a desired sound field from an array of sound sources arranged on a panel. The desired sound field allows a listener to perceive the sound as if the sound were coming from a live source and from a specified location. Setup of the sound system includes arranging a microphone array adjacent the array of sound sources to obtain a generated sound field. Arbitrary finite impulse response filters are then composed for each sound source within the array of sound sources. Iteration is applied to optimize filter coefficients such that the generated sound field resembles the desired sound field so that multi-channel equalization and wave field synthesis occur. After the filters are setup, the microphones may be removed.

20 Claims, 14 Drawing Sheets

OTHER PUBLICATIONS

Corteel, Etienne, et al.; Multichannel Inverse Filtering of Multiexciter Distributed Mode Loudspeakers for Wave Field Synthesis; Audio Engineering Society; Convention Paper 5611; 112th Convention; May 10-13, 2002; Munich Germany; pp. 1-5.

Horbach, Ulrich; Real-Time Rendering of Dynamic Scenes Using Wave Field Synthesis; 2002 IEEE; pp. 517-520.

International Preliminary Report from corresponding International Application No. PCT/US2004/01422.

Ulrich Horbach, Etienne Corteel, Renato S. Pellegrini, Edo Hulsebos, *Real-Time Rendering of Dynamic Scenes Using Wave Field Synthesis*, pp. 517-520, IEEE 2002.

Etienne Corteel, Ulrich Horbach and Renato S. Pellegrini, *Multichannel Inverse Filtering of Multiexciter Distributed Mode Loudspeakers for Wave Field Synthesis*, pp. 1-5, Audio Engineering Society Convention Paper 5611 Presented at the 112$^{th}$ Convention, May 10-13, 2002.

* cited by examiner

LOUDSPEAKER SYSTEM FOR VIRTUAL SOUND SYNTHESIS

PRIORITY

This application is a divisional of U.S. application Ser. No. 10/434,448, filed May 8, 2003, the disclosure of which is herein incorporated by reference.

BACKGROUND OF THE INVENTION

1. Technical Field

This invention relates to a sound reproduction system to produce sound synthesis from an array of exciters having a multi-channel input.

2. Related Art

Many sound reproduction systems use wave theory to reproduce sound. Wave theory includes the physical and perceptual laws of sound field generation and theories of human perception. Some sound reproduction systems that incorporate wave theory use a concept known as wave field synthesis. In this concept, wave theory is used to replace individual loudspeakers with loudspeaker arrays. The loudspeaker arrays are able to generate wave fronts that may appear to emanate from real or notional (virtual) sources. The wave fronts generate a representation of the original wave field in substantially the entire listening space, not merely at one or a few positions.

Wave field synthesis generally requires a large number of loudspeakers positioned around the listening area. Conventional loudspeakers typically are not used. Conventional loudspeakers usually include a driver, having an electromagnetic transducer and a cone, mounted in an enclosure. The enclosures may be stacked one on top of another in rows to obtain loudspeaker arrays. However, cone-driven loudspeakers are not practical because of the large number of transducers typically needed to perform wave field synthesis. A panel loudspeaker that can accommodate multiple transducers is usually used with wave field synthesis. A panel loudspeaker may be constructed of a plane of a light and stiff material in which bending waves are excited by electromagnetic exciters attached to the plane and fed with audio signals. Several of such constructed planes may be arranged partly or fully around the listening area.

While only the panel loudspeakers generate sound, wave theory also may be used so that the listener may perceive a synthesized sound field, or virtual sound field, from virtual sound sources. Apparent angles, distances and radiation characteristics of the sources may be specified, as well as properties of the synthesized acoustic environment. The exciters of the panel loudspeakers have non-uniform directivity characteristics and phase distortion, windowing effects due to the finite size of the panel. Room reflections also introduce difficulties of controlling the output of the loudspeakers.

SUMMARY

This invention provides a sound system that performs multi-channel equalization and wave field synthesis of a multi-exciter driven panel loudspeaker. The sound system utilizes filtering to obtain realistic spatial reproduction of sound images. The filtering includes a filter design for the perceptual reproduction of plane waves and has filters for the creation of sound sources that are perceived to be heard at various locations relative to the loudspeakers. The sound system may have a plurality N input sources and a plurality of M output channels. A processor is connected with respect to the input sources and the output channels. The processor includes a bank of N×M finite impulse response filters positioned within the processor. The processor further includes a plurality of M summing points connected with respect to the finite impulse response filters to superimpose wave fields of each input source. An array of M exciters is connected with respect to the processor.

A method for obtaining a virtual sound source in a system of loudspeakers such as that described above includes positioning the plurality of exciters into an array and then measuring the output of the exciters to obtain measured data in a matrix of impulse responses. The measured data may be obtained by positioning multiple microphones into a microphone array relative to the loudspeaker array to measure the output of the loudspeaker array. The microphone array is positioned to form a line spanning a listening area and individual microphones within the array are spaced apart to at least half of the spacing of the exciters within the loudspeaker array.

The measured data is then smoothed in the frequency domain to obtain frequency responses. The frequency responses are transformed to the time domain to obtain a matrix of impulse responses. Each impulse response may be synthesized each processed impulse response. An excess phase model is then calculated for each processed impulse response. The modeled phase responses are smoothed at higher frequencies and kept unchanged at lower frequencies.

Next, the system is equalized according to the virtual sound source to obtain lower filters up to the aliasing frequency. The system is equalized by specifying expected impulse responses for the virtual sound source at the microphone positions and then subsampling up to the aliasing frequency. Expected impulse responses may be obtained from a monopole source or a plane wave. A multichannel interactive algorithm, such as a modified affine projection algorithm, is next applied to compute equalization and position filters corresponding to the virtual sound source. Finally, the equalization/position filters are upsampled to an original sampling frequency to complete the equalization process. Further, linear phase equalization filters, called upper filters, are derived to use above the aliasing frequency, by computing a set of related impulse responses, averaging their magnitude, and inverting the results.

The upper filters and the lower filters are then composed to obtain a smooth link between low frequencies and high frequencies. Composing the upper filters and the lower filters includes: estimating a spatial windowing introduced by the equalizing step; calculating propagation delays from the virtual sound source to the plurality of loudspeakers; confirming that a balance between low and high frequencies remains correct; and correcting high frequency equalization filters.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
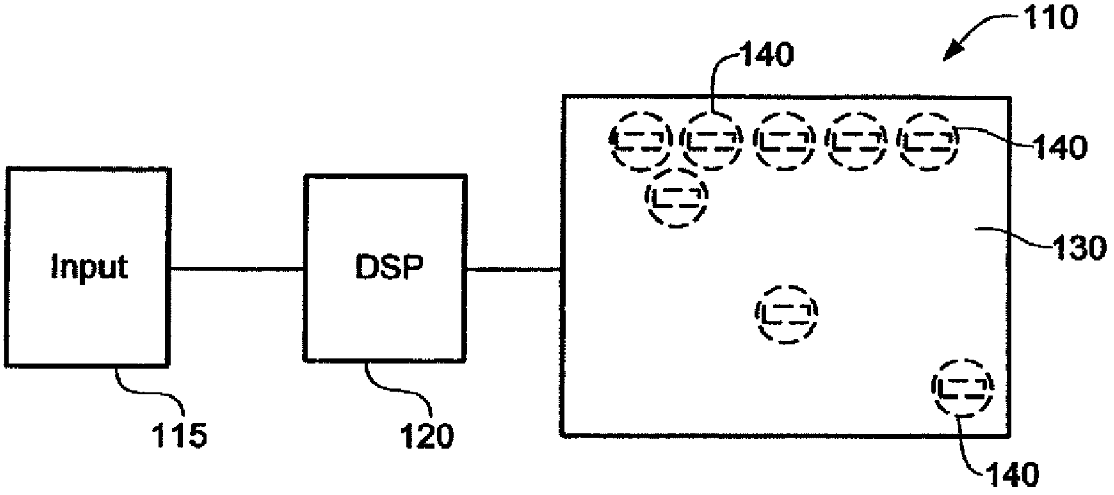
FIG. 1 is a block diagram of a sound system.
Figure 2:
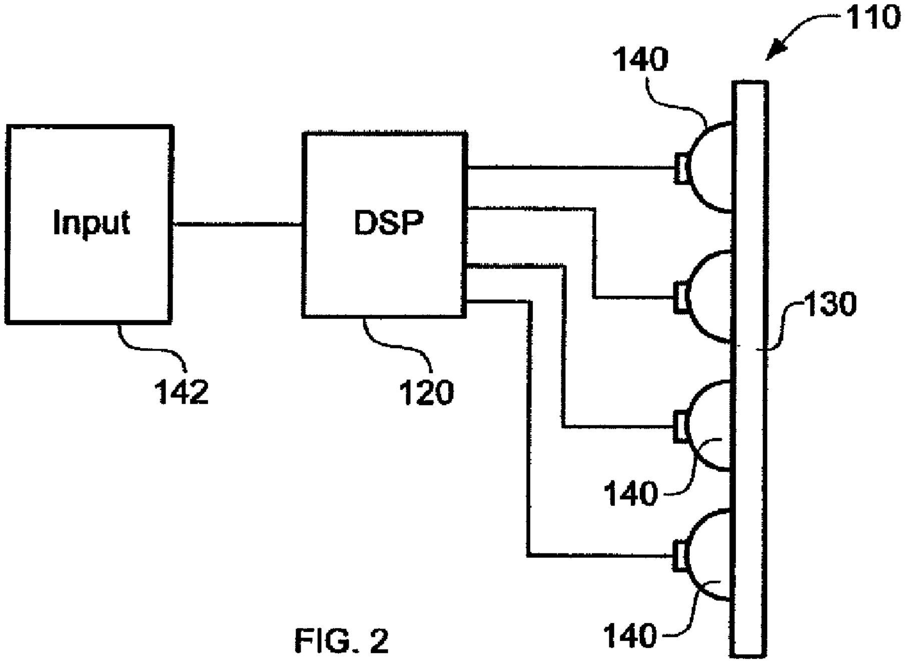
FIG. 2 is a side view of the sound system shown in FIG. 1.

FIGS. 1 and 2 are block diagrams of a sound system 100. The sound system 100 may include a loudspeaker 110 attached to an input 115 via a processor, such as a drive array processor or digital signal processor (DSP) 120. Construction of the loudspeaker 110 may include a panel 130 attached to one or more exciters 140, and no enclosure. Other loudspeakers may be used, such as those that include an enclosure. In addition, exciters 140 may include transducers and/or drivers, such as transducers coupled with cones or diaphragms. The panel 130 may include a diaphragm. Sound system 100 may have other configurations including those with fewer or additional components. One or more loudspeakers 110 could be used such that the loudspeakers 110 may be positioned in a cascade arrangement to allow for spatial audio reproduction over a large listening area.

Sound system 100 may use wave field synthesis and a higher number of individual channels to more accurately represent sound. Different numbers of individual channels may be used. The exciters 140 and the panel 130 receive signals from the input 115 through the processor 120. The signals actuate the exciters 140 to generate bending waves in the panel 130. The bending waves produce sound that may be directed at a determined location in the listening environment within which the loudspeaker 110 operates. Exciter 140 may be an Exciter FPM 3708C, Ser. No. 200100275, manufactured by the Harman/Becker Division of Harman International, Inc. located in Northridge, Calif. The exciters 140 on the panel 130 of the loudspeaker 110 may be arranged in different patterns. The exciters 140 may be arranged on the panel 130 in one or more line arrays and/or may be positioned using non-constant spacing between the exciters 140. The panel 130 may include different shapes, such as square, rectangular, triangular and oval, and may be sized to varying dimensions. The panel 130 may be produced of a flat, light and stiff material, such as 5 mm foam board with thin layers of paper laminated attached on both sides.

The loudspeaker 110 or multiple loudspeakers may be utilized in the listening environment to produce sound. Applications for the loudspeaker 110 include environments where loudspeaker arrays are required such as with direct speech enhancement in a theatre and sound reproduction in a cinema. Other environments may include surround sound reproduction of audio only and audio in combination with video in a home theatre and sound reproduction in a virtual reality theatre. Other applications may include sound reproduction in a simulator, sound reproduction for auralization and sound reproduction for teleconferencing. Yet other environments may include spatial sound reproduction systems with the panels 130 used as video projection screens.

Figure 3:
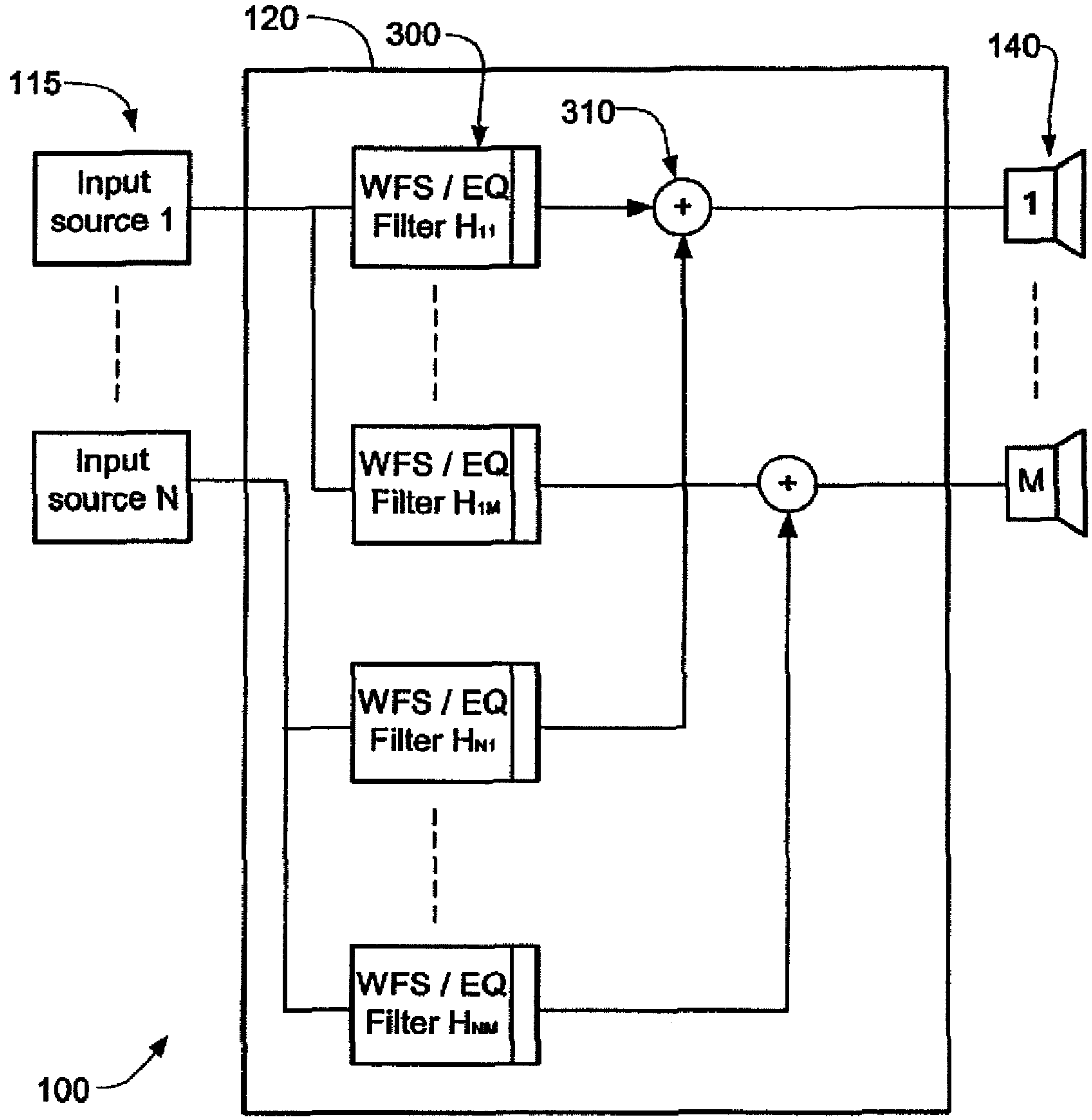
FIG. 3 is a schematic of the sound system show in FIG. 1.

FIG. 3 shows a schematic overview of the sound system 100 without the panel 130. The sound system 100 includes N input sources 115 and the processor 120, which contains a bank of N×M finite impulse response (FIR) filters 300 corresponding to the N input and M output channels. The processor 120 also includes M summing points 310, to superimpose the wave fields of each source. The M summing points connect to an array of M exciters 140, which usually contain D/A-converters, power amplifiers and transducers.

The digital signal processor 120 accounts for the diffuse behavior of the panel 130 and the individual directional characteristics of the exciters 140. Filters 300 are designed for the signal paths of a specified arrangement of the array of exciters 140. The filters 300 may be optimized such that the wave field of a given acoustical sound source wilt be approximated at a desired position in space within the listening environments. Since partly uncorrelated signals are applied to exciters 140 which are mounted on the same panel 130, the filters 300 may also be used to maintain distortion below an acceptable threshold. In addition, the panel 130 maintains some amount of internal damping to insure that the distortion level smoothly rises when applying multitone signals.

To tune the loudspeaker 110, coefficients of the filters 300 are optimized, such as, by applying an iterative process described below. The coefficients may be optimized such that the sound field generated from loudspeaker 110 resembles as close as possible a position in the listening environment and sound of a desired sound field, such as, a sound field that accurately represents the sound field produced by an original source. The coefficients may be optimized for other sound fields and/or listening environments. To perform the iterations, during set-up of the loudspeaker a sound field generated from the loudspeaker 110 may be measured by a microphone array, described below. Non-ideal characteristics of the exciters 140, such as angular-dependent irregular frequency responses and unwanted early reflections due to the sound environment of the particular implementation may be accounted for and reduced. Multi-channel equalization and wave field synthesis may be performed simultaneously. As used herein, functions that may be performed simultaneously may also be performed sequentially.

Figure 4:
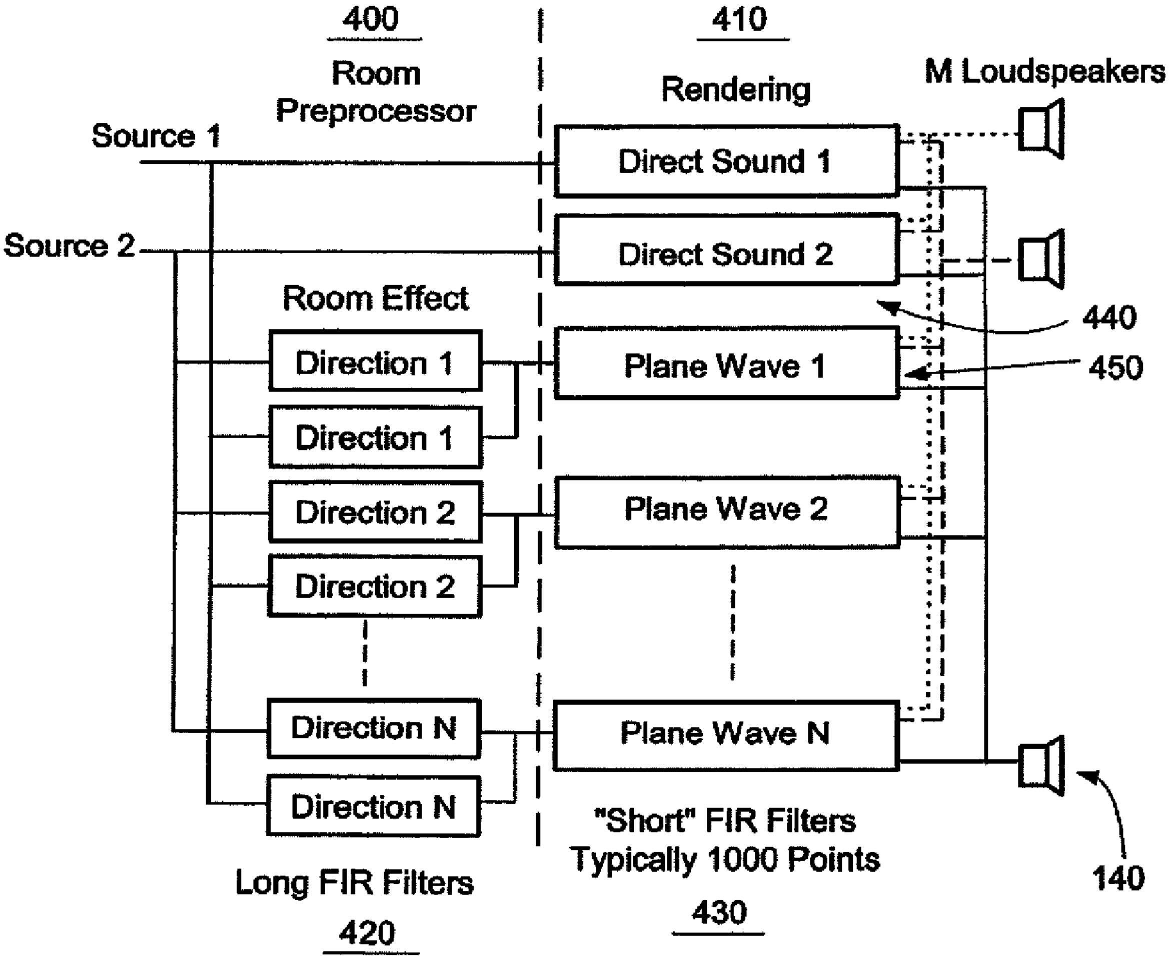
FIG. 4 is a block diagram of the sound system shown in FIG. 1 for reproduction of dynamic fields using wave field synthesis.

FIG. 4 is a block diagram of an implementation of the sound system 100 in which the filtering is divided into a room preprocessor 400 and rendering filters 410. The room preprocessor 400 and the rendering filters 410 may be used to reproduce sound fields to emulate varying sound environments. For example, long FIR filters 420 can be used to change the sound effect of a reproduced sound in accordance with the original sound source being a choir recorded in a cathedral or a jazz band recorded in a club. The long FIR filters 420 may also be used to change the perceived direction of the sound. The long FIR filters 420 may be set independent of an arrangement of the loudspeakers 110 and may be implemented with a processor, such as a personal computer, that includes applications suitable for convolution and adjustment of the long FIR filters 420. M long FIR filters 420 per input source may thus be derived for each change in either room effect or direct sound position.

The rendering filters 430 may be implemented with short FIR filters 430 and include direct sound filters 440 and plane wave filters 450, such as, filters 300 described in FIG. 3. Filters other than plane wave filters could be used, such as circular filters. Setup of the short FIR filters 430 depends on an arrangement of the loudspeakers 110. The short FIR filters 430 may be implemented with dedicated hardware attached to the loudspeakers 110, such as using a digital signal processor. The direct sound filters 440 are dedicated to the rendering of direct sound to dynamically allow for the efficient updating of a position of the virtual sound source within the sound environment. The plane wave filters 450, used for the creation of the plane waves, may be static, such as setup once for a particular loudspeaker 110, which diminishes the update cost on the rendering side. Such splitting of room processing and wave field synthesis associated with multi-channel equalization of the sound system 100 allows for costs to be minimized and may simplify the reproduction of dynamic sound environment scenes.

Figure 5:
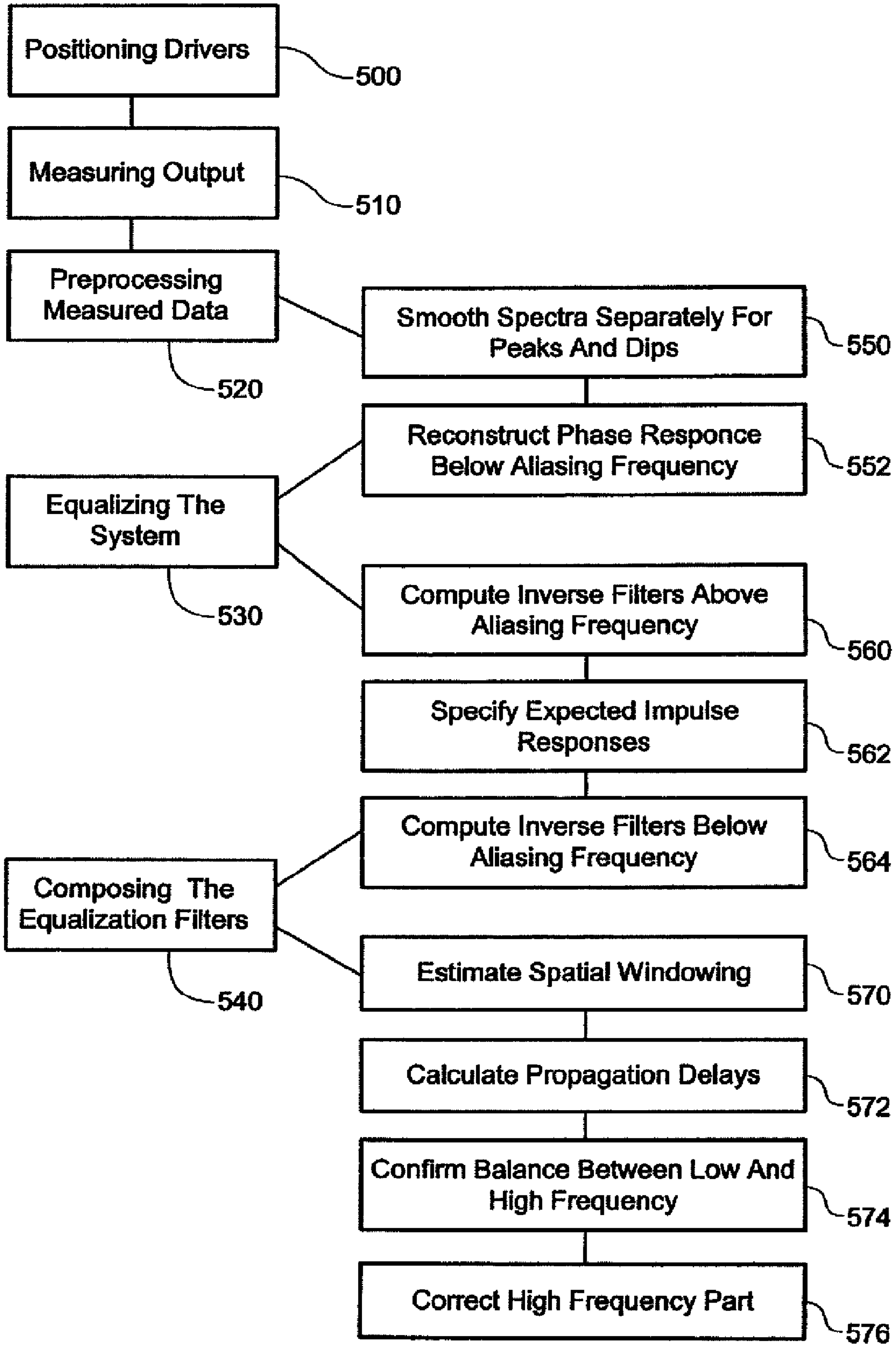
FIG. 5 is a flowchart showing a method for configuring the sound system.

FIG. 5 is a flowchart of a method for configuring the filters 300 of the sound system 100. Plane wave filters 450 may also be configured in this way. Coefficients of the filters 300 are determined in accordance with the virtual sound sources to be reproduced or synthesized. Each of the blocks of the method is described in turn in more detail below. At block 500, the exciters 140 are positioned on the panel 130. At block 510 in FIG. 5, an output of the exciters 140 is measured to obtain a matrix of impulse responses. At block 520, the data is preprocessed and smoothed. At block 530, the equalization is performed. At block 540, the equalization filters 300 are composed.

Figure 6:
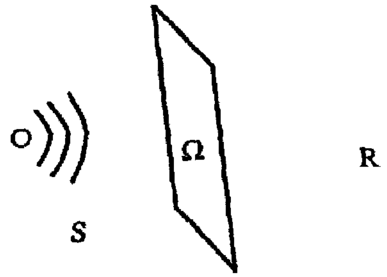
FIG. 6 is a block diagram that conceptually represents an infinite plane separating a source and a receiver.

FIG. 6 is a schematic representation of an infinite plane Ω separating a first subspace S and a second subspace R. To measure the output of the exciters, 140, a Rayleigh 2 integral states that the sound field produced in the second subspace R by a given sound source which is located in the first subspace S, is perfectly described by the acoustic pressure signals on an infinite plane Ω separating subspace S and subspace R. Therefore, if the sound pressure radiated by a set of secondary sources, such as the array of exciters 140, matches the pressure radiated by a desired target source located in subspace S on plane Ω, the sound field produced in subspace R equals the sound field that would have been produced by the target sound source. If the exciters 140 and the microphones 700 are all located in one horizontal plane, the surface Ω may be reduced to a line L at the intersection of Ω and the horizontal plane.

Since an aim of wave field synthesis is to reproduce a given sound field in the horizontal plane, a goal of the measurement procedure at block 510 is to capture as accurately as possible the sound field produced by each exciter 140 in the horizontal plane. As discussed with the Rayleigh 2 integral, this may be achieved by measuring the produced sound field on a line L. Other approaches may be used. Using forward and backward extrapolation, the sound field produced in the entire horizontal plane may be derived from the line L. When the sound field produced by the array of exciters 140 is correct on a line L, the sound field is likely correct in the whole horizontal plane.

Figure 7:
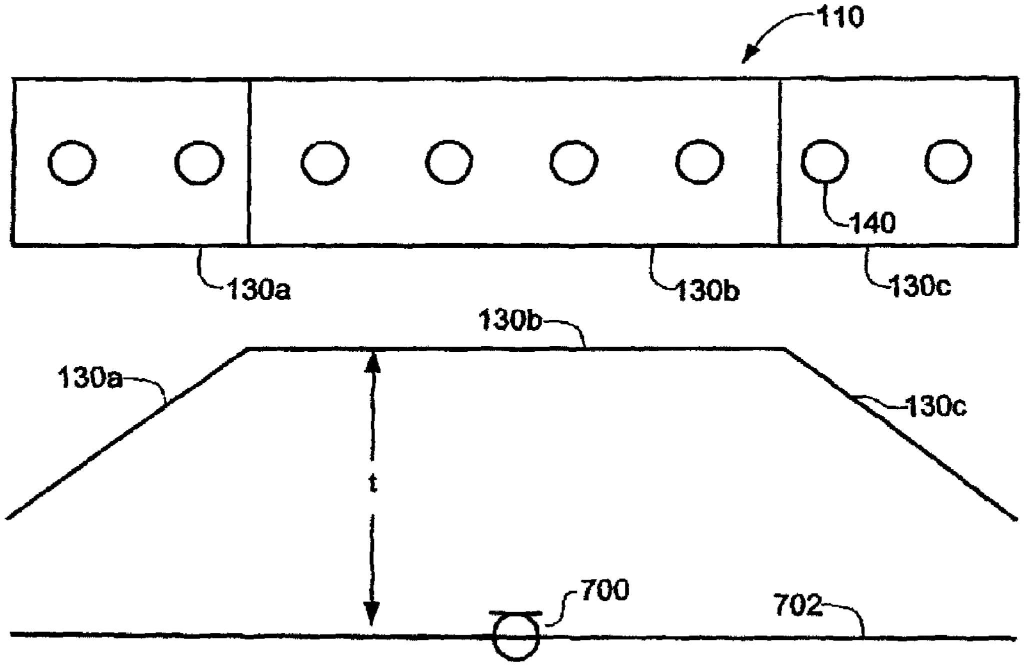
FIG. 7 is a block diagram of an array of exciters in relation to a microphone bar.

FIG. 7 shows a linear arrangement of exciters 140 to be measured, Eight exciters 140 are attached equidistantly along a line on a panel having a size of about 60 cm by about 140 cm. Other numbers of exciters and/or panels of other dimensions may be used. One arrangement of loudspeakers 110 includes three panels 130*a*, 130*b* and 130*c*, where the two outer panels, 130*a* and 130*c*, are tilted by an angle of about 30 degrees with respect to the central panel 130*b*. The arrangement of the exciters 140 on the panels 130*a*, 130*b* and 130*c* may vary, as well as characteristics of varying exciters 140 and panels 130*a*, 130*b* and 130*c*. Therefore, the described method may be performed separately for different loudspeaker 110. The method may be performed once or more for each particular loudspeaker 110 arrangement. The design of the filters 300 is described to synthesize a wave field of a given virtual source in a horizontal plane. The virtual source could be synthesized in other planes as well.

At block 510 in FIG. 5, to measure output of the loudspeakers 110, one or more microphones 700 are positioned on a guide 702, such as a bar, located a distance t of about 1.5 m, to the center panel 130*b*. The microphones 700 measure output in an area that spans the whole listening zone. The microphones 700 may include an omni-directional microphone. A maximum length sequences (MLS) technique may be used to accomplish the measuring. The spacing of the microphone positions may include at least half the spacing of the array speakers or exciters 140, to be able to measure the emitted sound field with accuracy. Typical approximate values include, for a spacing of the exciters 140 of about 10-20 cm, spacing of microphone positions at about 5-10 cm, and measured impulse response lengths of about 50-300 msec. One microphone 700 may measure sound and then be moved along the bar to obtain multiple impulse responses with respect to each exciter 140, or an array of multiple microphones may be used. The microphone 700 may be removed from the sound system 100 after configuration.

Figure 8:
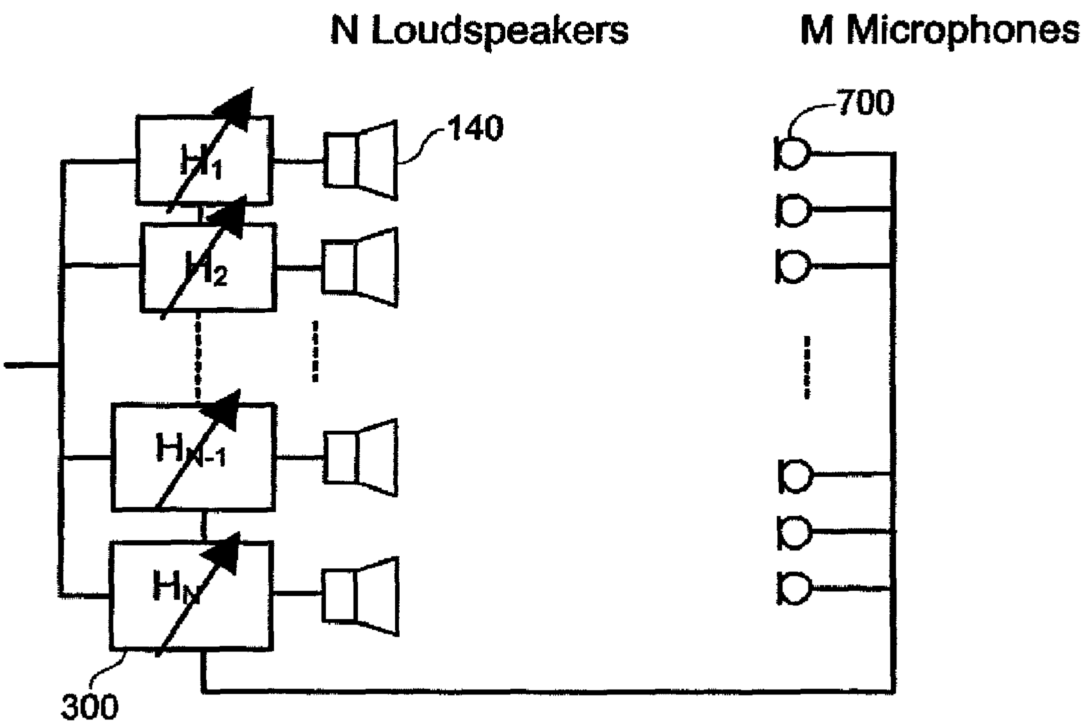
FIG. 8 is a block diagram of a system for measuring X exciters with Y microphones.

FIG. 8 is a block diagram that illustrates a multi-channel inverse filter design system in which N exciters 140 are fed by N filters 300 and M signals from microphones 700. A multi-channel iterative procedure may be used that generates the coefficients of a filter or array of filters 300 inputted to the exciters 140. The filters 300 may be utilized to approximate the sound field of a virtual sound source according to a least mean square (LMS) error measured at the M spatial sample points, such as microphones 700. The sound field produced by the exciters 140 at the M microphone positions is described by measuring impulse responses from the exciters 140 to the microphone 700. The multi-channel, iterative procedure generates the coefficients of filters 300. The sound field of a desired virtual source may be approximated according to a least mean square error measure at the M spatial sample points.

hi (i=[1 . . . Nls]) corresponds with the Nls impulse responses of the filters 300 to be applied to the exciters 140 of the array for a given desired virtual sound source. C corresponds with the matrix of measured impulse responses such that Ci,j(n) is the impulse response of the driver j at the microphone position i at the time n. C(n) corresponds with the $N_{ls}*N_{mic}$ dimensional matrix having all the impulse responses at time n corresponding to every driver/microphone combinations. dj (j=[1 . . . Nmic]), includes the Nmic impulse responses corresponding to the desired signals at the microphone positions.

The vector w of length $N_{ls}*L_{filt}$ is determined such that $w((n-1)*N_{ls}+i)=h^i(n)$ (i=[1 . . . Nls]); where $S_n=[C(n)\ C(n-1) \ldots C(n-L_{filt})]^t$ is the $(N_{ls}*L_{filt})*N_{mic}$ dimensional matrix of measured impulse responses; and $d_n=[d^1(n)d^2(n) \ldots d^{N_{mic}}(n)]^t$ is the Nmic desired signals at time n. The error signal vector $e_n=[e^1(n)e^2(n) \ldots N_{mic}(n)]^t$ may be calculated as $e_n=d_n-S_n{}^t*w$.

Figure 9:
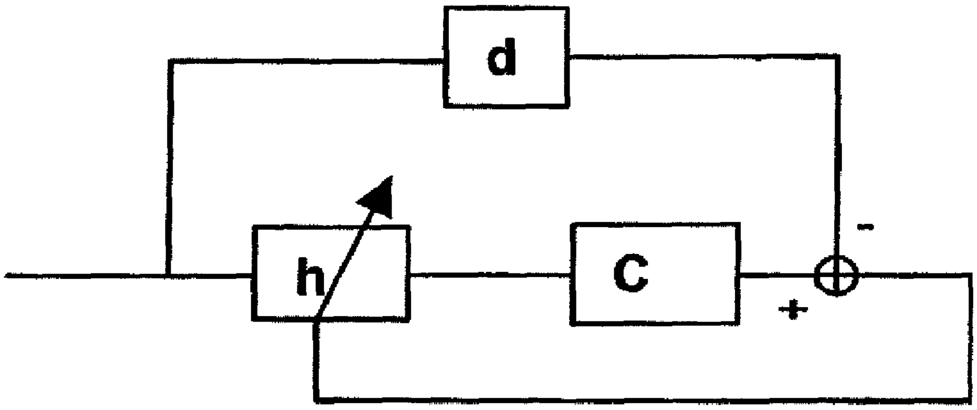
FIG. 9 is a block diagram representing recursive optimization.

When a goal is to minimize $J_c=E[(e_n)^2]$ where E corresponds to an expectation operator, this least mean square problem may be solved with commonly available iterative algorithms, such as recursive optimization, to calculate w. FIG. 9 is a diagram of an exemplary recursive optimization. Other algorithms may be used such as a multi-channel version of the modified fast affine projection (MFAP) algorithm. An advantage of MFAP over conventional least mean square (LMS) is that MFAP uses past errors to improve convergence speed and quality.

Figure 10:
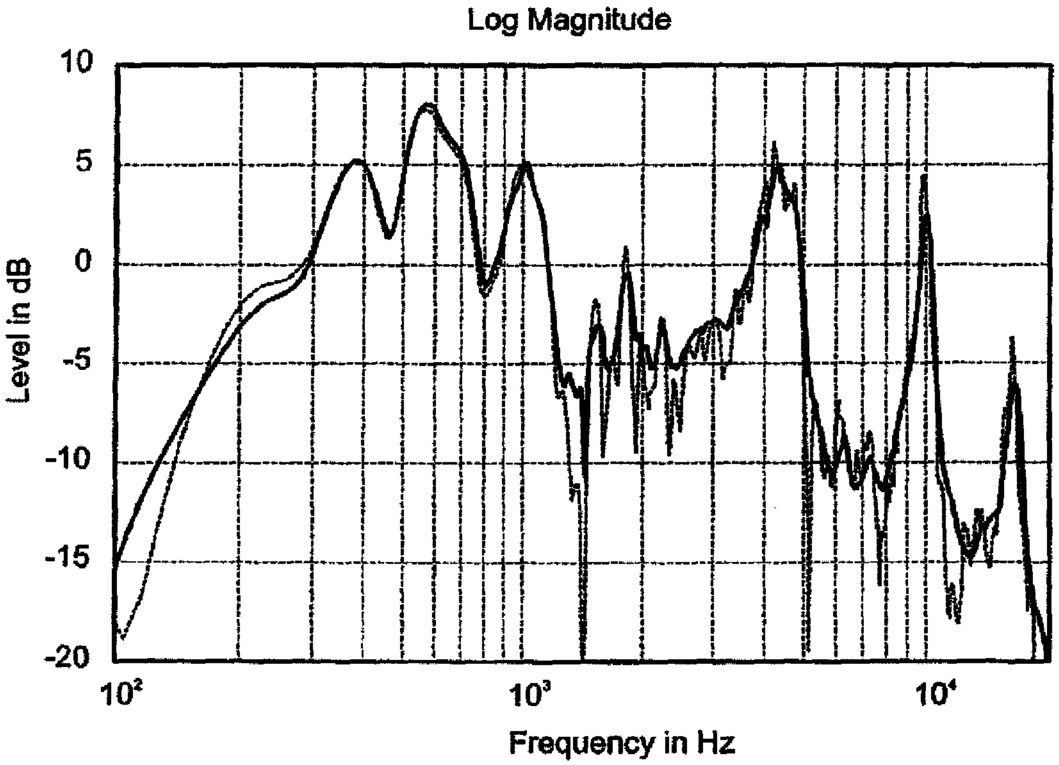
FIG. 10 is a graph showing original and smoothed frequency responses.
Figure 11:
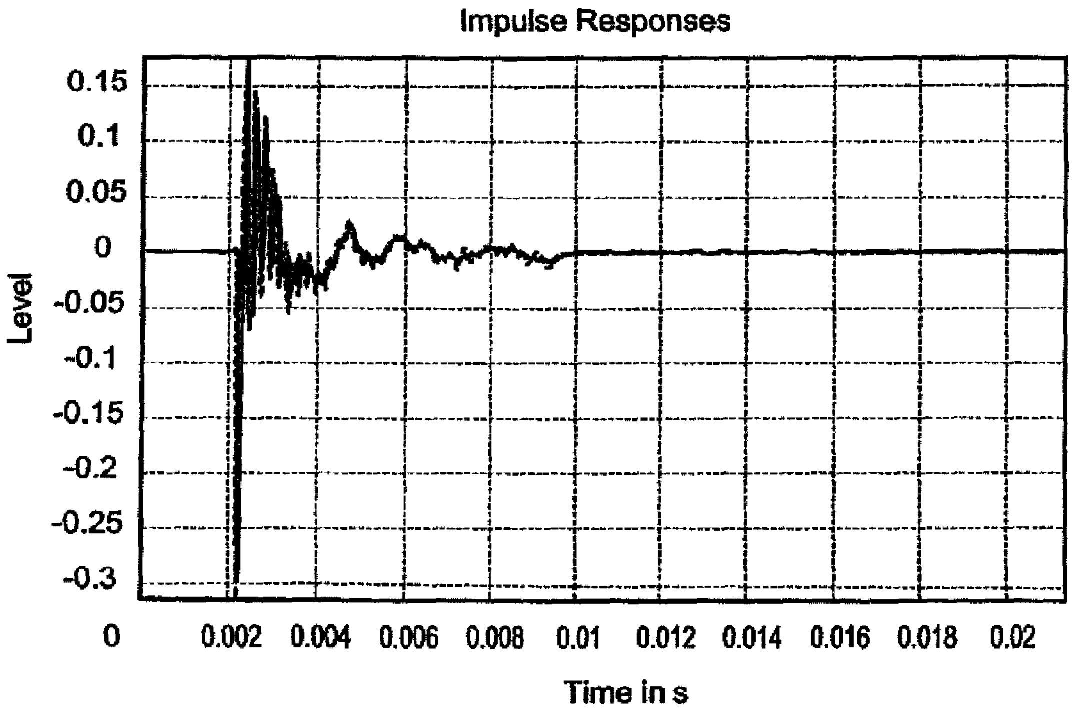
FIG. 11 is a graph showing impulse responses corresponding with the frequency responses shown in FIG. 10.

Frequency responses of loudspeakers 110 may contain sharp nulls in the sound output due to interferences of late arriving, temporarily and spatially diffuse waves. An inverse filter may produce strong peaks at certain frequencies that may be audible and undesired. FIG. 10 is a graph showing an original unsmoothed frequency response as a dotted line and a more preferable smoothed frequency response as a solid line. FIG. 11 is a graph showing impulse responses corresponding with the frequency responses shown in FIG. 13. Smoothing may be employed using nonlinear procedures in the frequency domain to discriminate between peaks and dips, while preserving an initial phase relationships between the various exciters 140. The smoothing ensures that the inverse filter 300 may attenuate the peaks, leave strong dips unaltered, and generate the desired signals as specified both in the time and frequency domains.

At blocks 520, 550 and 552 of FIG. 5, the measured data is processed to smooth the data. Smoothing the data includes, at block 550, smoothing the peaks and the dips separately in the frequency domain, and, at block 552, modeling and reconstructing the phase response. Smoothing is applied in the frequency domain, and a new matrix of impulse responses is obtained by transforming the frequency response to the time domain, such as with an inverse Fast Fourier Transform (FFT). The smoothing process may be applied to the complete matrix of impulse responses. For ease of explanation, the process is applied to one of the impulse responses of the matrix, a vector IMP.

Smoothing Peaks and Dips Separately in the Frequency Domain:

For impulse responses:

The log-magnitude vector is computed for IMP.

$IMP_{dB}=20*\log_{10}(abs(fft(imp)))$

The log-magnitude is smoothed using half octave band windows $\Rightarrow IMP_{dB}^{smoo}$.

The difference vector is computed between the smoothed and the original magnitude $\Rightarrow DIFF_{or/smoo}$.

The negative values are set below a properly chosen threshold to zero $\Rightarrow DIFF_{or/smoo}^{thre}$.

The results are smoothed using a half-tone window $\Rightarrow DIFF_{or/smoo}^{thre/smoo}$.

The result is added to the smoothed log-magnitude $\Rightarrow IMP_{dB}^{smoo/thre}$.

Synthesis of the Impulse Response:

For the processed impulse response, the initial delay T is extracted, such as by taking the first point in the impulse response which equals 10% of the amplitude of the maximum. The impulse response synthesis is then achieved by calculating the minimum phase representation of the smoothed magnitude and by adding zeros in front to restore the corresponding delay $\Rightarrow IMP_{mp}^{smoo}$.

Excess Phase Modeling:

An impulse response is computed that represents the minimum phase part of the measured one.

The corresponding phase part $\phi mp(f)$ is extracted.

The first initial delay section of the impulse response is removed from t=0 to t=T−1.

The phase is extracted out of the result $\phi or(f)$.

Compute $\phi ex(f)=\phi or(f)-\phi mp(f)$.

Octave band smoothing of $\phi ex(f)$ is processed.

Replacement by the Original Impulse Response at Low Frequencies:

Phase of $imp_{mp}^{smoo}$ is corrected with $\phi ex(f) \Rightarrow imp_{mp/ex}^{smoo}$.

Phase $\phi ex/mp(f)$ is extracted from $imp_{mp/ex}^{smoo}$.

The optimum frequency $f_{corn}^{opt}$ in $\lfloor f_{corn}-win/2, f_{corn}+win/2 \rfloor$ is determined which minimizes the difference between $\phi or(f)$ and $\phi ex/mp(f)$.

The corresponding frequency response is synthesized in the frequency domain using IMP up to $f_{corn}^{opt}$ and $IMP_{mp/ex}^{smoo}$ afterwards $\Rightarrow IMP^{smoo}$.

Synthesize the corresponding impulse response $\Rightarrow IMP^{smoo}$.

Replace $IMP^{smoo}$ by zeros from t=0 to t=T−1. Utilizing the measured data in this way produces meaningful results at low frequencies, below a corner frequency, caused at least in part by a visible of the loudspeakers 110.

Figure 12:
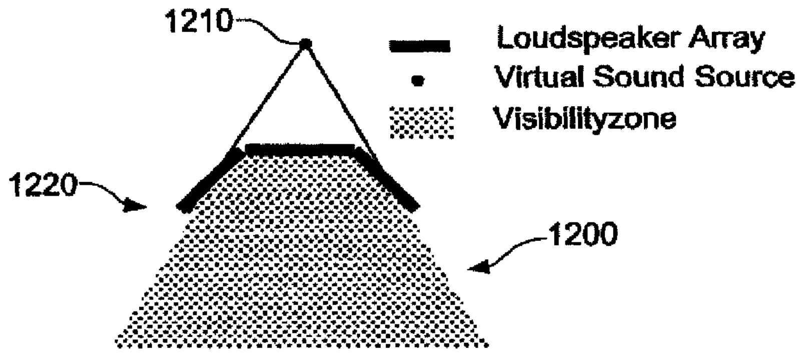
FIG. 12 is a block diagram of an approximate visibility of a given sound source through a loudspeaker array.

FIG. 12 is an overhead view of an approximate visible area 1200 of a given sound source 1210 produced by a loudspeaker array 1220. Outside of the visible area 1200, attempting to synthesize the sound field with measured data may not produce meaningful results. Due to the finite length of the loudspeaker array 1220, windowing effects are introduced, which may cause a defined visible area 1200 to be restricted. The measured data is valid up to the corresponding aliasing frequency. In addition to the physical limitations, the finite number of exciters 140 and the nonzero distance between exciters 140 may cause spatial subsampling to be introduced to the reproduced sound field. While subsampling may be used to reduce computational cost, the subsampling may cause spatial aliasing above certain frequencies, known as the corner frequency. Moreover, the limited number of positions of the microphones 700 may cause inaccuracies due to the spatial aliasing.

In FIG. 5, at block 530, equalization is performed on the exciters 140 to account for frequencies above and below the aliasing or corner frequency. The equalization may be most accurate at the microphone 700, not the loudspeaker 110, therefore, forward and backward extrapolation may be used to ensure that the sound field is correctly reproduced over the whole listening area. At block 560, inverse filters 300 are computed above the corner or aliasing frequency. Above the corner frequency, the sound field can be perfectly equalized at the positions of the microphones 700, but may be unpredictable elsewhere. Therefore, above the corner frequency, an adaptive model may replace a physical modeling of the desired sound field. The modeling may be optimized so that the listener cannot perceive a difference between the emitted sound and a true representation of the sound.

Figure 13:
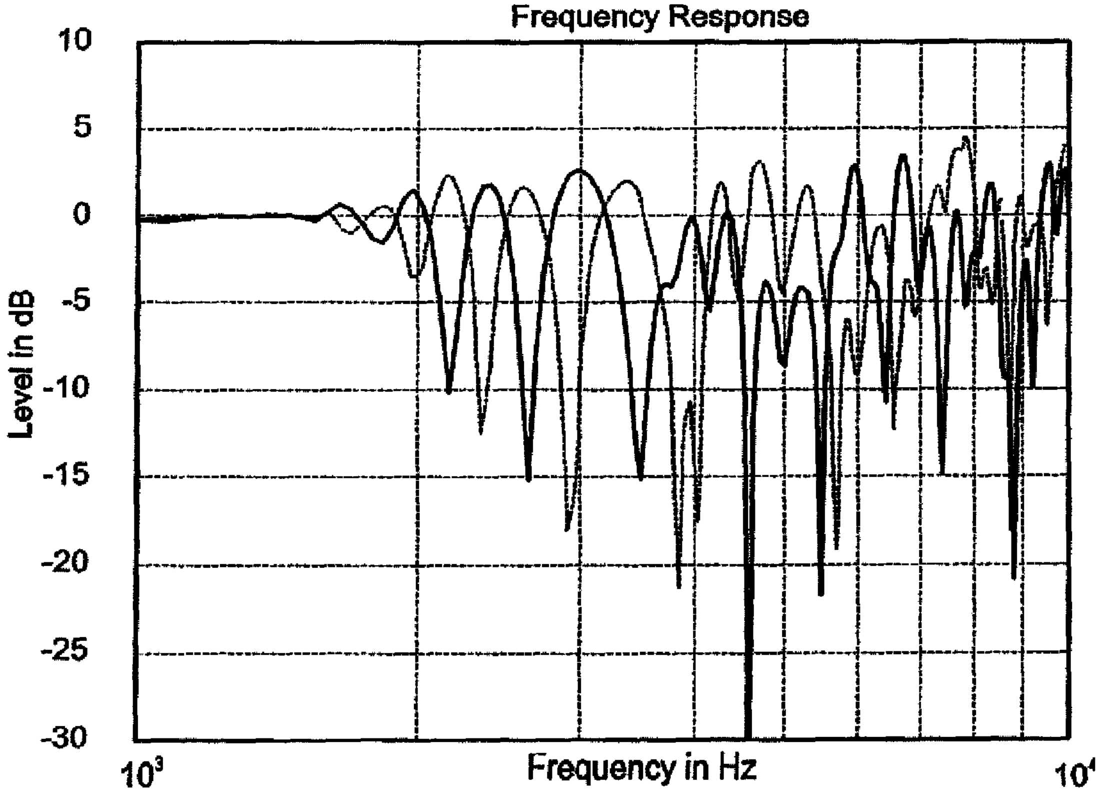
FIG. 13 is a graph showing typical frequency responses (about 1,000-10,000 Hz) of a produced sound field using wave field synthesis measured with microphones at about 10 cm distance from each other.

FIG. 13 shows examples of frequency responses that may be obtained at two close measurement points for a simulated array of ideal monopoles using delayed signals. The graph shows typical frequency responses (about 1,000 to about 10,000 Hz) of a produced sound field using wave field synthesis measured at a distance of about 10 cm from each other. The frequency responses exhibit typical comb-filter-like characteristics known from interferences of delayed waves. An equalization procedure for the high frequency range employs individual equalization of the exciters 140 combined with energy control of the produced sound field. The procedure may be aimed at recovering the sound field in a perceptual, if not physically exact, sense.

Above the aliasing frequency, the array exciters 140 may be equalized independently from each other by performing spatial averaging over varying measurements, such as one measurement on-axis and two measurements symmetrical off-axis. Other amounts of measurements may be used. At block 562, the obtained average frequency response is inversed and the expected impulse response of the corresponding filter is calculated as a linear phase filter. An energy control step is then performed, to optimize the transition between the low and high frequency filters 300, and minimize sound coloration. The energy produced at positions of the microphones 700 is calculated in frequency bands. Averages are then computed over the points between the microphones 700 and the result is compared with the result the desired sound source would have ideally produced.

At block 564, coefficients of filters 300 are computed for frequencies below the corner or aliasing frequency. The coefficients may be calculated in the time domain for a prescribed virtual source position and direction, which includes a vector of desired impulse responses at the microphone positions as target functions, as specified in block 562. The coefficients of the filters 300 may be generated such that the error between the signal vector produced by the array and the desired signal vector is minimized according to a mean square error distance. A matrix of impulse responses is then obtained, that describe the signal paths from the exciters 140 to each measurement point, such as microphone 700. The matrix is inverted according to the reproduction of a given virtual sound source, such as multi-channel inverse filtering.

A value of the corner frequency depends on the curvature of the wave fronts, the geometry of the loudspeaker array 110, and the distance to the listener. In the below example, a filter design procedure to equalize the system is applied for a corner frequency of about 1-3 kHz.

Computing the Filters Above the Aliasing Frequency of 1.3 kHz:

At block 560, inverse filters above the aliasing frequency are computed. To derive prototype equalization filters for the high frequencies, the matrix of impulse responses $MIR^{smoo}$ is used. By knowing the positions of the exciters 140 and the microphones 700, the angular position θ is computed of the microphones 700 to the axis of the exciters 140. For each exciter 140, three impulses responses are determined, corresponding to the on-axis direction (θ=0) and two symmetrical off axis measurements (θ=±θoa). Compensation is performed for the difference of distance in the measurements. If R is the distance between the considered exciter 140 and the position of the microphone 700, R may multiply the impulse response.

Using the measured data, for each exciter 140 the magnitude of the three determined impulse responses is computed, the magnitude is averaged for the impulse responses, and the average magnitude is inverted. The corresponding impulse response may be synthesized as a linear phase filter using a windowed Fourier transform $\Rightarrow h_{eqhf}^{i}$ (i=[1 . . . Nls]).

Alternatively, less or more than three different positions may be used; the original matrix of measured impulse responses may be used, and/or after the inversion, the associated minimum phase filter may be synthesized, and the inverse filter may be computed in magnitude and phase.

Specification of the Impulse Responses for the Desired Virtual Sound Source at the Microphone Positions:

At block 562, to design filters 300 for the combined equalization and positioning of a virtual sound source, a set of expected impulse responses is specified at each position of the microphone 700. The set may either be derived from measured or simulated data. A sufficient amount of delay deq in accordance with the expected filter length may be specified as well.

As examples, described below is the common case of a monopole source and a plane wave.

Monopole Source

A monopole source is considered as a point sound source. The acoustic power radiated by the source may be independent on the angle of incidence and may be attenuated by $1/R^2$, where R is the distance to the source. At the microphone positions 500, the pressure need only be specified if omnidirectional microphones are used. The propagation delay di is related to Ri and the speed of the sound in air c by $d_i=R_i/c$ (for the i-th microphone). The global delay deq for the equalization is added to all di. Normalization is performed by setting dcent, the delay at the center microphone position, to deq. Similarly, the attenuations are normalized to 1 at this position.

Plane Wave

The wave front of a plane wave includes the same angle of incidence at each position in space and no attenuation. When reproducing a plane wave with the loudspeaker 110, a non-zero attenuation may occur which is considered during the specification procedure. In a first approximation, the pressure decay of an infinitely long continuous line array is given by $1/\sqrt{R}$. For monopole sources, the pressure and delays are normalized at the center microphone position of the line of microphones 700. Considering a plane wave having an angle of incidence θ, the time (resp. distance) to be considered for the delay (resp. attenuation) may be set as the time for the plane wave to travel to pi. The reference time (origin) is set to the time when the plane wave arrives at the center of the microphone line. This time ti may thus be negative if the plane wave arrives earlier at the considered position. The corresponding distance Ri is set negative as well. The attenuation for the position pi is then given by $1/\sqrt{1+R_i}$.

Subsampling Below the Defined Corner Frequency:

At block 564, the equalization/positioning filters 300 are calculated up to the aliasing frequency, such as, $f_s''=(1.3)$ kHz. Subsampling of the data by a factor of M is possible, where $M<fs/f_s''$, and fs is the usual corner frequency of the audio system of about 16-24 kHz. Subsampling applies to all measured impulse responses and desired responses at the microphone positions. Each impulse response may be processed using low-pass filtering of the impulse response using a linear phase filter and subsampling of the filtered impulse response keeping one of each sequence of M samples. The low pass filter may be designed such that the attenuation at $f_s''$ is at least about 80 dB.

Multi-Channel Adaptive Process:

Utilizing $E_n=d_n-S_n^{t}*w_{n-1}$ mentioned above, the vector $\xi$ is determined as $\xi_n=[C(n)C(n-1)\ldots C(n-N+1)]^t$.

w may be iteratively calculated to minimize the mean quadratic error. A temporary version of w called wn is then calculated at the time n, as follows:

Initialization $$P_0=\delta^{-1}*I_{L_{filt}*N},\ r_0=0,\ \eta_0=0,\ w_0=0$$

Pn is updated:

$$a_n=P_{n-1}*\eta_{n-1}$$

$$\alpha=(I_{N_{mic}}+\xi_n^{t}*a_n)^{-1}$$

$$q_n=P_{n-1}*\eta_{n-L_{filt}}$$

$$b_n=q_n-\alpha*(a_n*\eta_{n-L_{filt}})*a_n$$

$$\beta=(-I_{N_{mic}}+\eta_{n-L_{filt}}^{t}*b_n)^{-1}$$

$$P_n=P_{n-1}-\alpha*a_n*a_n^{t}-\beta*b_n*b_n^{t}$$

en is calculated:

$$r_n=r_{n-1}+\xi_{n-1}^{t}*s_n-\xi_{n-L_{filt}-1}^{t}*s_{n-L_{filt}}$$

$$e_n=d_n-w_{n-1}^{t}*s_n-\mu*\overline{\eta}_{n-1}^{t}*r_n$$

wn and $\overline{\eta}^n$ are updated:

$$\varepsilon_n=\mu*e_n*P_{n,N_{mic}}$$

$$\eta_n=\begin{bmatrix}0\\ \overline{\eta}_{n-1}\end{bmatrix}+\varepsilon_n$$

$$w_n=w_{n-1}+\mu*\eta_{n,N}^{t}*s_{n-N+1}$$

where $\xi_n$ corresponds to the $(N-1)*N_{mic}$ first elements of $\xi_n$, $\eta_{n,N_{mic}}$ to the $(N-1)*N_{mic}$ last elements of $\eta_n$, and $P_{n,N_{mic}}$ to the first Nmic columns of Pn.

If the impulse responses are of length L, the process may be continued until n=L. To improve the quality of the equalization, the process may be repeated using the last calculated filters wL for w0. The calculation of Pn need only be accomplished once and may be stored and reused for the next iteration. The results may improve each time the operation is repeated, i.e., the mean quadratic error may be decreased.

The individual filters 300 for exciters 140 are then extracted from w.

Upsampling:

The calculated filters are upsampled to the original sampling frequency by factor M.

Wave Field Synthesis/Multi-Channel Equalization of the System According to a Given Virtual Sound Source:

Since, at block 562, the impulse responses may be specified for the desired virtual sound source at the microphone positions, at block 564, virtual sound source positioning and equalization may be achieved simultaneously, up to the aliasing frequency of about 1-3 kHz. To reduce processing cost, subsampling may be performed with respect to the defined corner frequency.

Composition of the Filters:

At block 540, wave field reconstruction of the produced sound field may be performed. The filters 300 may be composed with the multi-channel solution for low frequencies, such as frequencies below the corner frequency, and the individual equalization at high frequencies, such as frequencies at or above the corner frequency. Appropriate delays and scale factors may be set for the high frequency part. At block 570, spatial windowing introduced by the multi-channel equalization is estimated. At block 572, propagation delays are calculated. At block 574, the filters 300 are composed and then energy control is performed. At block 576, high frequency is corrected of the filters 300 and the filters 300 are composed.

Estimation of the Spatial Windowing Introduced by the Multi-Channel Equalization:

At block 570, the spatial windowing introduced by the multi-channel equalization may be estimated to set the power for the high frequency part of the filters 300. The estimation may be accomplished by applying the above-described multi-channel procedure to a monopole model. A certain number of iterations are required, such as five.

For each filter calculated hi (i=[1 . . . Nls]), it is then used to compute the frequency response, and calculate the power in $[f_{corn}-win,\ f_{corn}]\Rightarrow G_i^{meq}$.

Calculation of the Delays:

At block 572, the propagation delays may be calculated from the virtual sound source to the positions of the exciters 140. The calculation may be similar to the one used for the calculation of the desired signals by replacing the microphone positions by the exciter positions $\Rightarrow d_i^{the}$ (i=[1 . . . Nls]). The delay introduced by the multi-channel equalization is determined. Only one delay need be estimated and used as a reference. The filter 300 corresponding to the exciter 140 may be placed at the center of the area used in the array. If the exciters 1 to 21 are used for the multi-channel procedure, the filter corresponding to exciter 11 may be used for delay matching. The estimation of the delay is accomplished by taking the time when the maximum absolute amplitude is reached. $\Rightarrow d_{ref}^{multi}$.

The delays applied to the high frequency part of the filters are $d_i^{hf}=d_i^{the}-d_{ref}^{the}+d_{ref}^{multi}$ (i=[1 . . . Nls]).

First Composition of the Filters:

The composition of the filters 300 may be achieved in the frequency domain. For each corresponding exciter 140:

The frequency response is computed for both filters. $\Rightarrow H_i^{meq}=\mathrm{fft}(h_i^{meq})$ and $H_i^{eqhf}=\mathrm{fft}(h_i^{eqhf})$;

The delay may be extracted of the high frequency equalization filter. $\Rightarrow d_i^{eqhf}$;

The phase of $H_i^{eqhf}$ may be corrected such the remaining delay equals $d_i^{hf}$. $\Rightarrow \hat{H}_i^{eqhf}$;

Multiply by $G_i^{meq}$, spatial windowing introduced by the multi-channel process. $\Rightarrow \tilde{H}_i^{eqhf}=G_i^{meq}*\hat{H}_i^{eqhf}$;

The filter may be composed using $H_i^{meq}(f)$ for $f=\lfloor o, f_i^{corn}\rfloor$ and $\tilde{H}_i^{eqhf}(f)$ for $f=]f_i^{corn}, f_s/2]$. $\Rightarrow H_i^{eq}(f)$;

The negative frequencies may be completed using the conjugate of positive frequencies. $\Rightarrow H_i^{eq}(f)=\mathrm{conj}(H_i^{eq}(-f))$ for $f=]-f_s/2, 0[$; and The corresponding impulse responses may be restored to the time domain. $\Rightarrow h_i^{eq}=\mathrm{real}(\mathrm{ifft}(H_i^{eq}))$.

Energy Control:

At block 574, balance may be confirmed between the low and high frequencies. Energy control may be used to ensure that the balance between low and high frequencies remains correct. Energy control also may be used to compensate for the increased directivity of the exciters 140 at high frequencies.

The matrix of impulse responses may be processed with $h_i^{eq}$. ⇒$Mir^{eq}$;

For each microphone position, the contribution coming from each exciter 140 may be summed.

$$\Rightarrow Mic_j^{eq} = \sum_{i=1}^{N_{ls}} Mir_{i,j}^{eq} \text{ for } j = [1 \ldots Nmic];$$

For each microphone position, the frequency response may be processed. ⇒$MIC_j^{eq}$=fft($Mic_j^{eq}$);

For each microphone position, the energy in N frequency bands fbk may be extracted. ⇒$En_j(fb_k)$;

The average of energy along the microphone positions may be computed for each frequency band. ⇒$En(fb_k)$;

Similarly, the mean energy may be extracted in frequency bands from the desired signals, ⇒$En^{des}(fb_k)$; and In each frequency band, weighting factors may be extracted such that the mean energy produced equals the mean energy of the desired signal. ⇒$G^{cor}(fb_k)$.

Correction of High Frequency Equalization Filters:

At block 576, to correct the high frequency equalization filters, a linear phase filter may be desirable. The window process may be used in the linear phase filter. The center frequency fk of each frequency band is specified and $G^{cor}$ $(fb_k)$ may be associated to the center frequency. The equalization filters for high frequencies are then processed with the correction filter. ⇒$\hat{h}_i^{eqhf}$, i=[1 . . . Nls].

Final Composition of the Filters:

This process may be similar to the first part of the first composition process applied on $h_i^{meq}$ and $\hat{h}_i^{eqhf}$.

The choice of the corner frequency is now determined such that it minimizes the phase difference between low and high frequency part: extract phase of $H_i^{meq}$ and $\hat{H}_i^{eqhf}$. ⇒$\phi_i^{meq}$, $\hat{\phi}_i^{eqhf}$; the difference is computed; and search in $\lfloor f_i^{corn}-win^{corn}, f_i^{corn} \rfloor$, the frequency that minimizes the phase difference. ⇒$\hat{f}_i^{corn}$.

A linear interpolation may then be achieved to make a smooth link in amplitude between the low and high frequency part. A few number of points may be used in $\hat{H}_i^{eqhf}$:

$$a = \frac{\left(\left|\hat{H}_i^{eqhf}\left(\hat{f}_i^{com} + win^{in}\right)\right| - \left|H_i^{meq}(\hat{f}_i^{com})\right|\right)}{win^{in}}$$

$$b = \left|H_i^{meq}(\hat{f}_i^{com})\right| - a * \hat{f}_i^{com}$$

$$\hat{H}_i^{eqhf}(f) = (a * f + b) * \exp(j * \hat{\varphi}_i^{eqhf}(f)) f \in \left[\hat{f}_i^{com}, \hat{f}_i^{com} + win^{in}\right]$$

Figure 14:
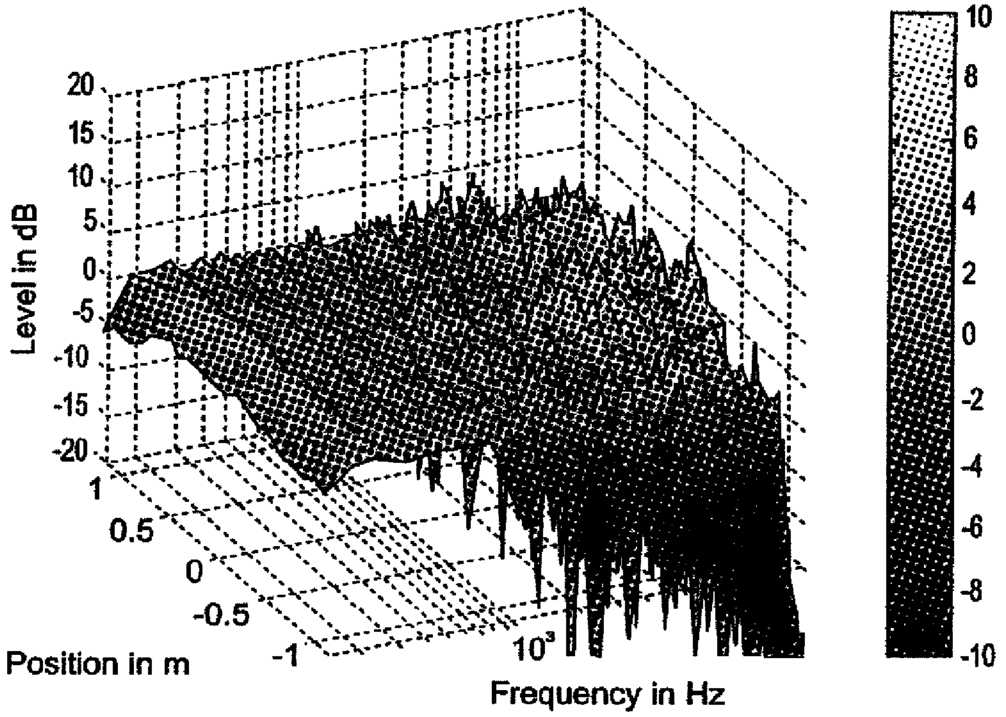
FIG. 14 is a graph showing frequency response of the multi-exciter panels array on the microphone line using filters calculated with respect to a plane wave propagating perpendicular to the microphone line.
Figure 15:
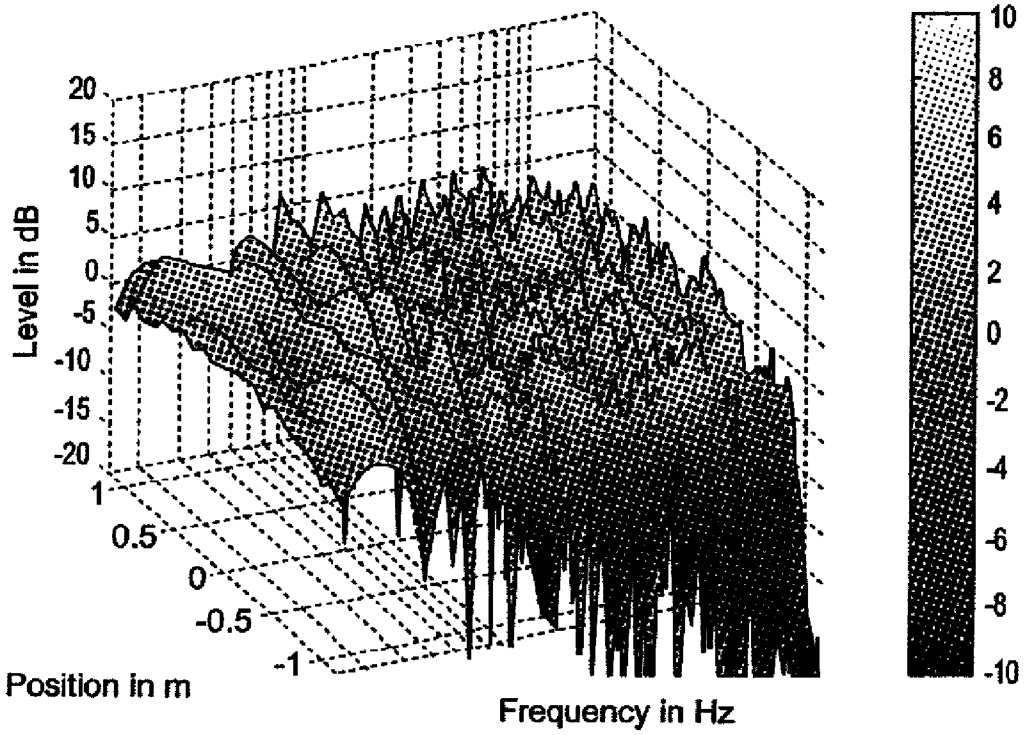
FIG. 15 is a graph showing frequency response of the multi-exciter panels array simulated on the microphone line using filters calculated with wave field synthesis theory combined with individual equalization according to a plane wave propagating perpendicular to the microphone line.

Dynamic Synthesis Using Loudspeaker Arrays Optimization of the Reproduction System:

FIG. 14 is a graph showing typical frequency responses of sound system of FIG. 7 having three panels 130 of eight exciters 140 positioned along a microphone line 702. Filters 300 are calculated for a plane wave propagating perpendicular to the microphone line. The resulting flat area below the aliasing frequency, shown in FIG. 14, may be compared to equalization that is applied separately to the individual channels, the result of which is shown in FIG. 15.

Sound systems 100 having about 32-128 individual channels may be used to reproduce a whole acoustic scene. The sound systems 100 may have other numbers of individual channels. In each of the channels, filters 300 having a length of about 500-2000 are used, to reproduce a sound source at a defined angular position and distance. A multi-channel, iterative LMS-based filter design algorithm as described above is employed to equalize sets of frequency responses, which are measured at the listening area by microphones 700. With respect to the frequency responses, the desired virtual sound source with given directivity characteristics may be produced, such as shown in FIG. 14. Angle-dependent deficiencies of the exciters 140, early reflections in the listening room and other factors may be corrected.

Exemplary Panel:

The following graphs refer to panel 130 constructed from a foam board with paper laminated on both sides, which has been optimized for that application.

Figure 16:
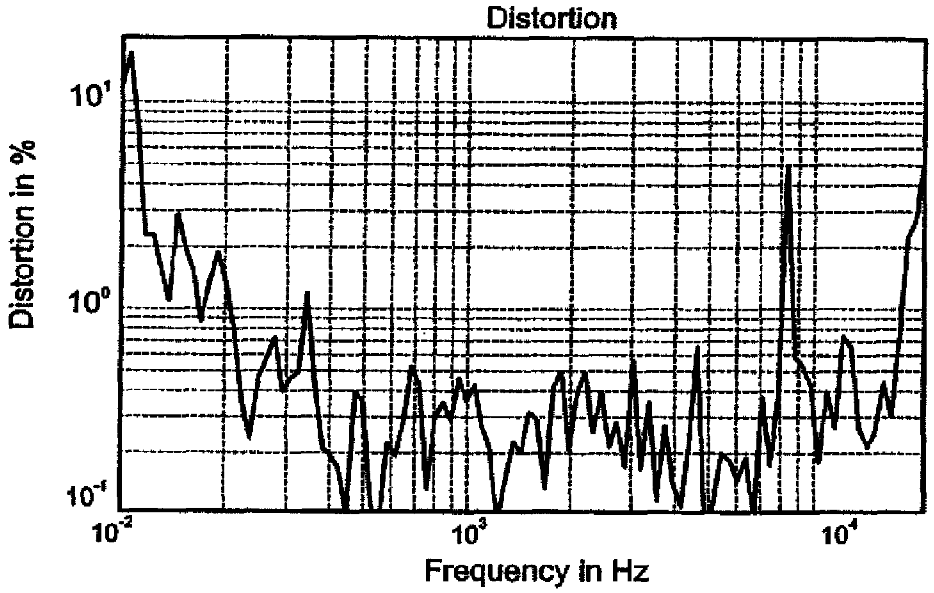
FIG. 16 is a graph showing total harmonic distortion produced by a single exciter.

FIG. 16 shows the performance, percentage of total harmonic distortion (THD) vs. frequency at about 95 dB sound pressure level (SPL), of a panel 130 having a size of about 1.4 m by about 0.6 m with a single exciter 140 attached. Within the used bandwidth of about 150-16000 Hz, the THD remains below about 1% except at some precise frequency points that correspond to nulls in the frequency response.

Figure 17:
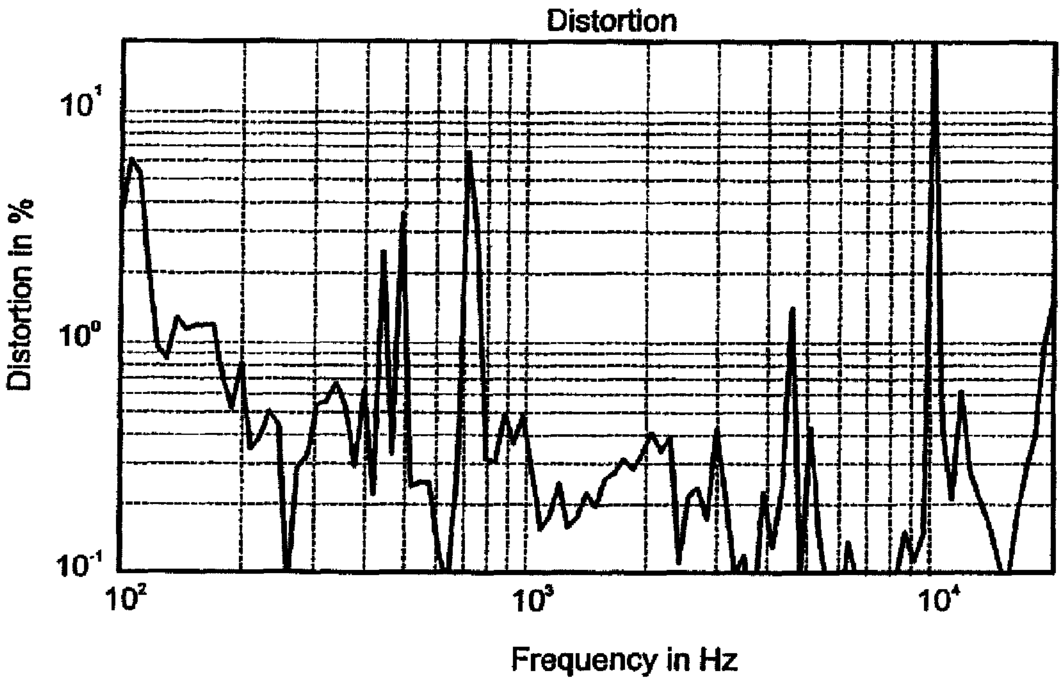
FIG. 17 is a graph showing total harmonic distortion produced by two close exciters with a ninety-degree phase difference.

FIG. 17 shows the performance for two closely positioned exciters 140 simultaneously with frequency independent 90 degrees phase difference. The THD remains mainly below about 1% with peaks corresponding to nulls in the frequency response. The second situation is typical for wave field synthesis in which the exciters of one panel attached on one single surface are driven by delayed signals.

Figure 18:
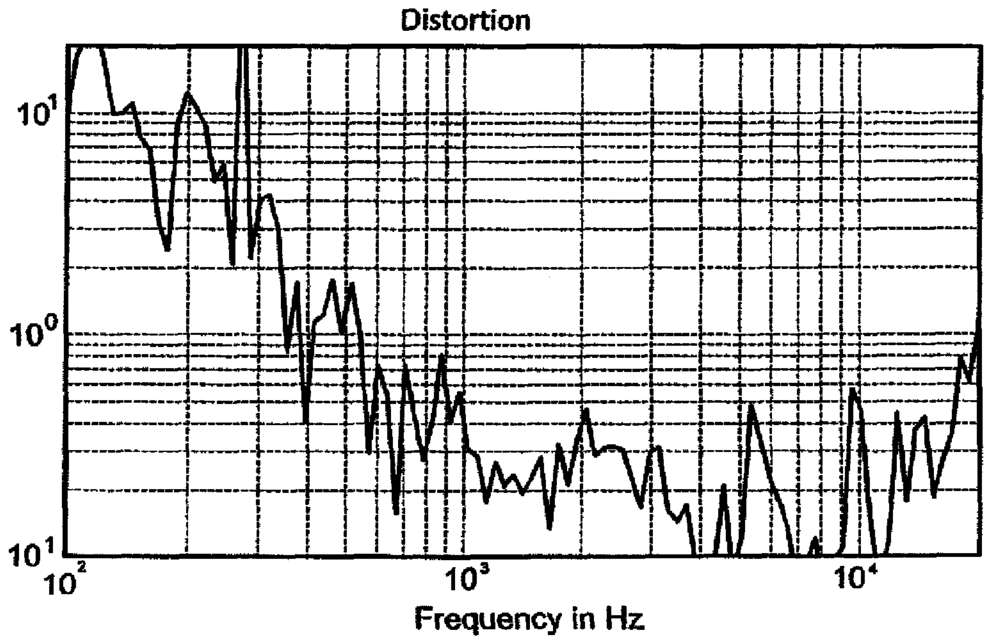
FIG. 18 is a graph showing total harmonic distortion produced by two close exciters driven by opposite phase signals.

FIG. 18 shows a worst case performance with opposite phase signals, such as, about 180 degree phase difference, which produces a result in the low frequency domain where the distortion remains at about 10% and up to about 300 Hz and then decreases to below about 1% thereafter. For wave field synthesis applications such large phase differences between two closely located exciters are normally not the case. For a spacing of about 20 cm of the exciters 140 the signals may be in opposite of phase starting at about 850 Hz, a frequency at which THD is generally acceptable.

Experimental Results:

The above-described process has been tested with an arrangement of three multi-exciter panel modules 110 of eight channels each, corresponding to a 24 channel system. The output was measured at 24 microphone positions with 10 cm spacing on a line at 1.5 m distance from the center panel. The corresponding experimental configuration is shown schematically in FIG. 19.

An aliasing frequency of around 2000 Hz is observed in this example. Below this frequency, the obtained frequency response is flat along the microphone line (about ±2 dB), whereas in the latter case (basic wave field synthesis theory plus individual equalization), the frequency response is much more irregular, exhibiting peaks and dips of more than about 6 dB depending on the position.

Above the aliasing frequency, fluctuations are observed in both produced sound fields. However, between about 2000 and 4000 Hz, by using the proposed energy control procedure, undesirable peaks are considerably reduced. There is consequently much less coloration, which could be confirmed during listening experiences.

Figure 19:
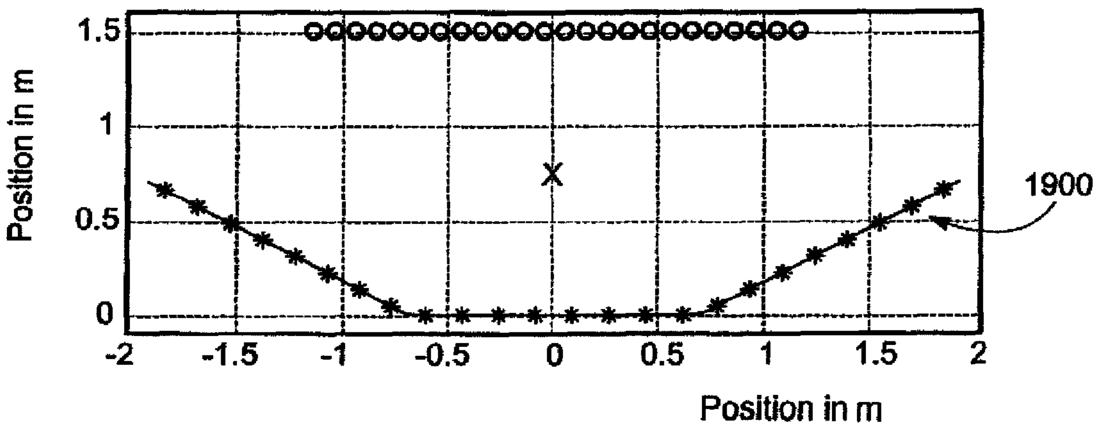
FIG. 19 is a graph showing a configuration for measurement of three multi-exciter panel modules and twenty-four microphone positions.
Figure 20:
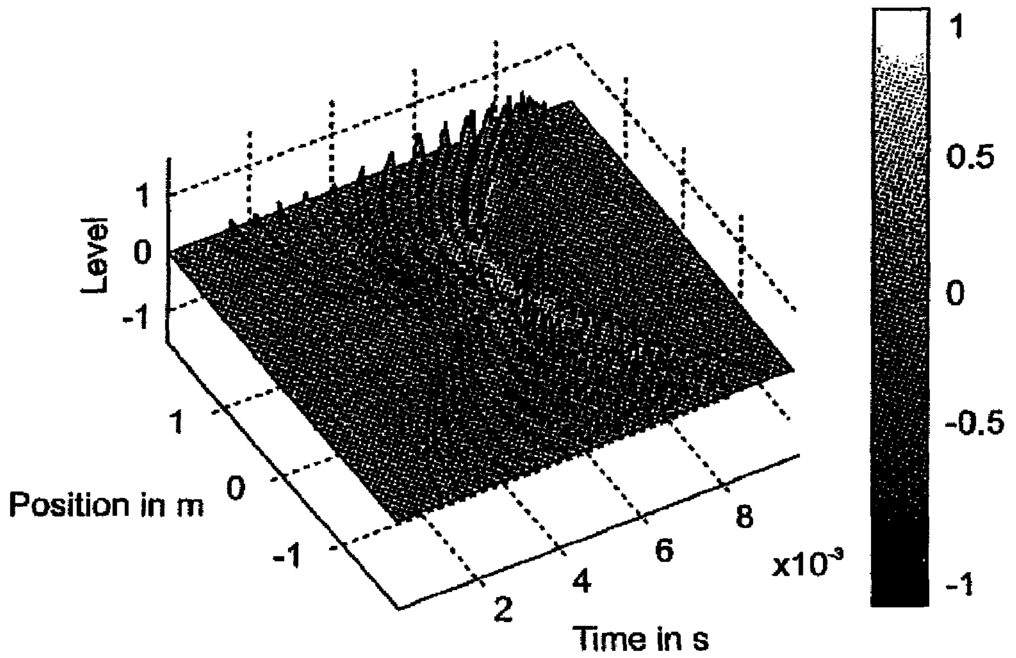
FIG. 20 is a graph showing impulse responses for a focused source, reproduced by an array of monopoles.

FIG. 19 shows a focused sound source X located between the loudspeaker and the microphone array. To synthesize such a source, a concave wave front is produced by the loudspeaker array 1900, which ideally converges at the intended virtual sound source position and is remitted from this position forming a convex wave front. Above the aliasing frequency, such wave fronts are not synthesized. The main difference compared to other virtual sources like plane waves is that aliased contributions arrive before the main wave front, such as shown in FIG. 20.

Figure 21:
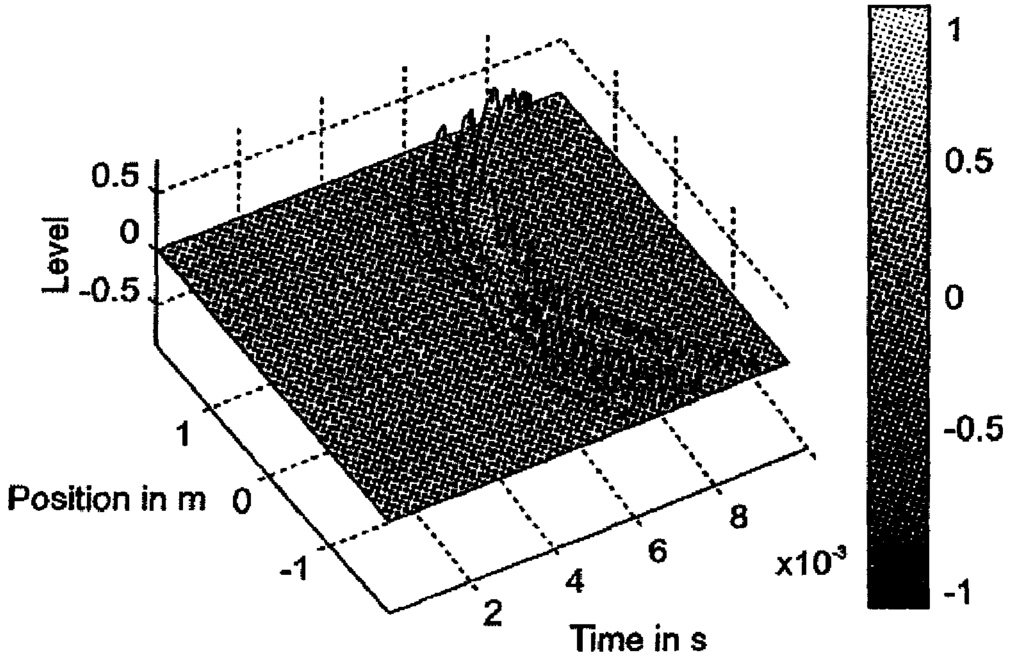
FIG. 21 is a graph showing impulse responses with spatial windowing above the aliasing frequency.

To synthesize a concave wave front by the loudspeaker array 1900, the delays to be applied to the side loudspeakers are shorter than at the middle. Therefore, above the aliasing frequency, as individual contributions of the exciters 140 do not sum together to form a given wave front, the first wave front does not emanate from the virtual sound source position but more from the closest loudspeakers. The aliased contributions may be reduced by using spatial windowing above the aliasing frequency to limit the high frequency content radiated from the side loudspeaker 110. The improved situation is shown in the graph in FIG. 21.

Figure 22:
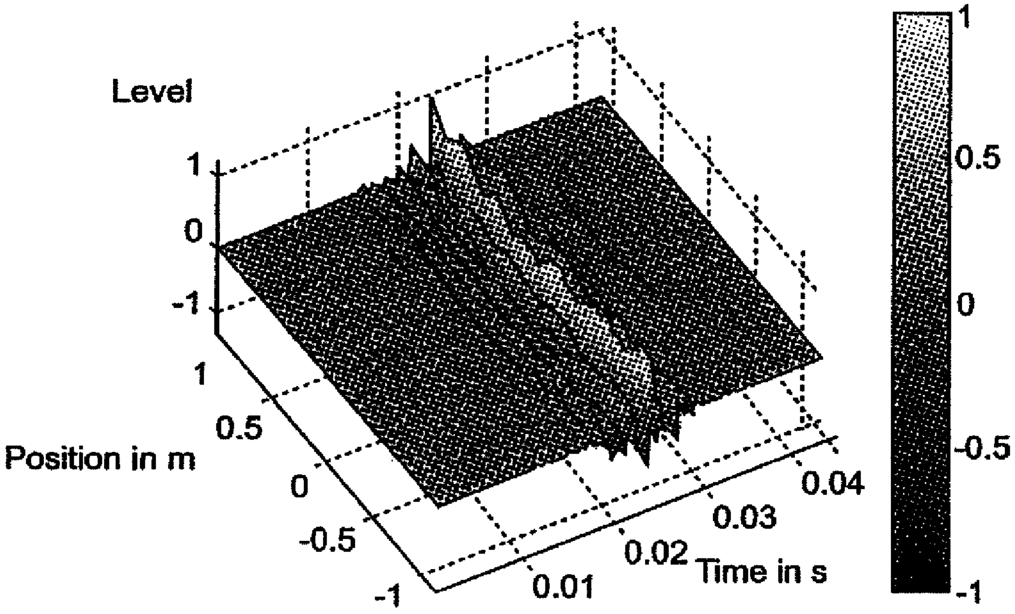
FIG. 22 is a graph showing impulse responses of a focused source, reproduced by an array, bandlimited to the spatial aliasing frequency.
Figure 23:
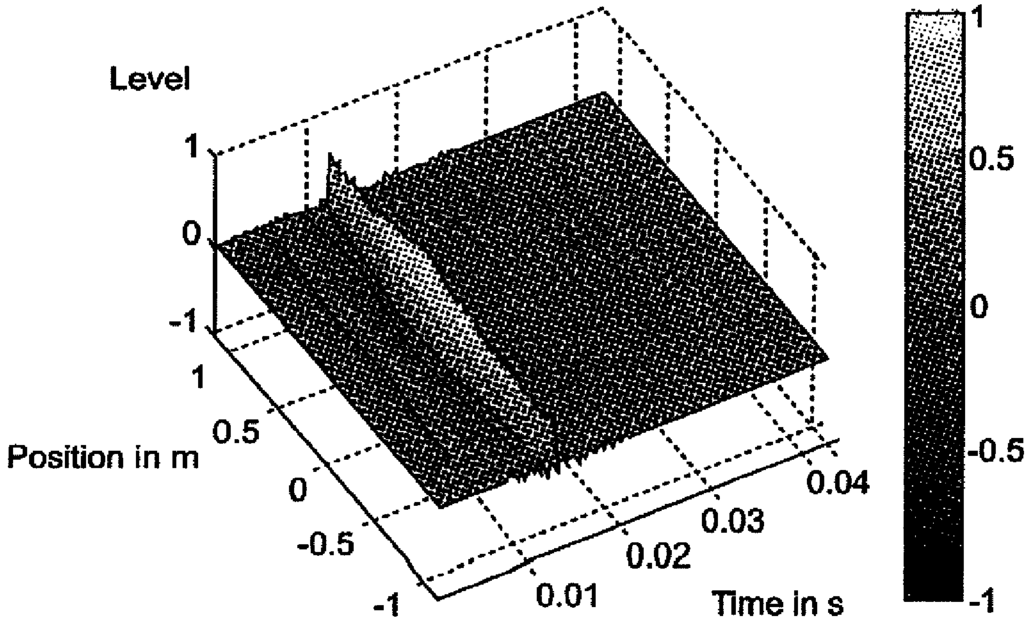
FIG. 23 is a graph showing impulse responses with the application of the multichannel equalization algorithm.
Figure 24:
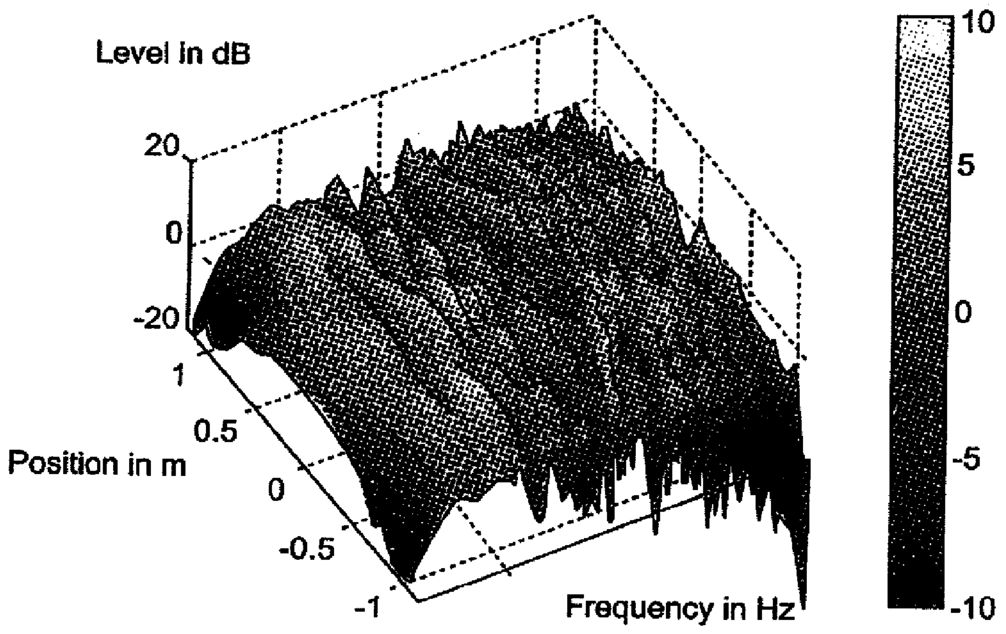
FIG. 24 is a graph showing a spectral plot of frequency responses corresponding with impulse responses of FIG. 22.
Figure 25:
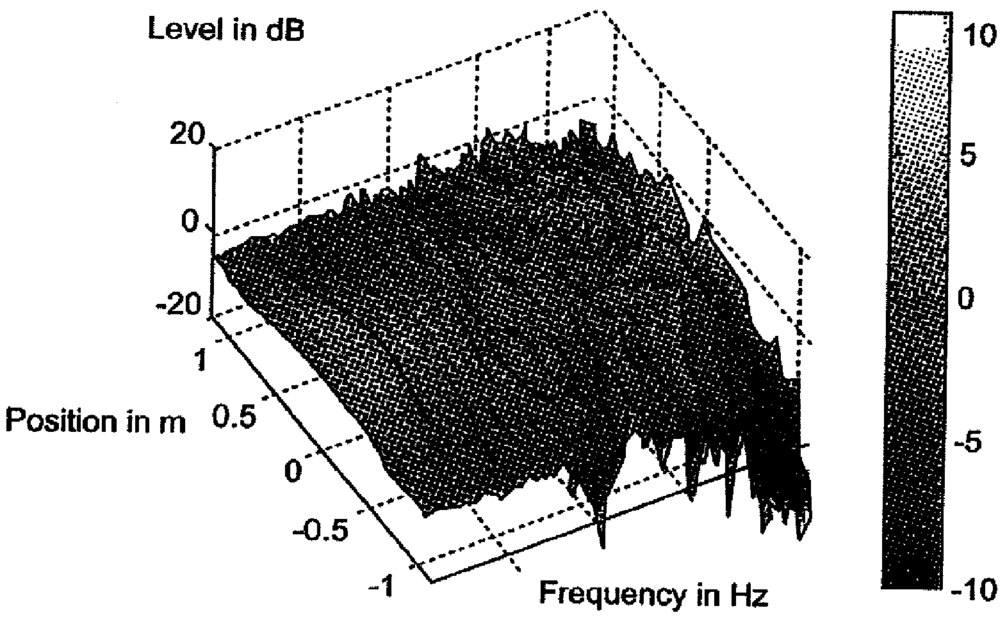
FIG. 25 is a graph showing a spectral plot of frequency responses corresponding with impulse responses of FIG. 23.

The resulting set of impulse responses and the spectra measured are displayed in FIGS. 22 and 24, respectively. The improved output obtained after the equalization procedure are shown in FIG. 23, impulse responses, and FIG. 25, frequency responses. As a result, both time and frequency domain deficiencies of distributed mode transducers are considerably reduced, to become able to generate the wave field of a desired virtual sound source in front of them.

In another experiment, frequency responses were produced by an array of 32 exciters 140 with about 15 cm spacing using wave field synthesis to produce a plane wave to propagate perpendicular to the array. Aliasing occurred at about 2500 Hz at about 1.5 m and between about 300 and 4000 Hz at about 3.5 m. Therefore, the filter deign may depend on the normal average distance of the listener to the array of exciters 140. In cinemas and similar applications, where the listeners may be seated at a large distance to the array, a wider spacing of the array of exciters 140 may be used.

While various embodiments of the invention have been described, it will be apparent to those of ordinary skill in the art that other embodiments and implementations are possible within the scope of the invention. Accordingly, the invention is not to be restricted except in light of the attached claims and their equivalents.

What is claimed is:

1. A sound system comprising:

a plurality of N input sources;

a plurality of M output channels;

a digital, signal processor connected with respect to the ~put sources and the output channels;

a bank of N×M finite impulse response filters positioned within the digital signal processor;

a plurality of M summing points connected with respect to the finite impulse response filters, to superimpose wave fields of each input source of the plurality of input sources;

an array of M loudspeakers, each loudspeaker of the array connected with respect to one summing point of the plurality of summing points;

where the N×M finite impulse response filters are configured by providing at least one microphone positioned proximate to the array of M loudspeakers to measure an output of the loudspeakers and to obtain a matrix of impulse responses;

configuring the N×M finite impulse response filters as linear phase upper equalization filters above an aliasing frequency by averaging acoustical energy configuring lower equalization filters up to the aliasing frequency according to a virtual, sound source by:

specifying expected impulse responses corresponding to the virtual sound source at the microphone positions;

subsampling up to the aliasing frequency;

applying a multichannel iterative algorithm to compute equalization and position filters corresponding to the virtual sound source; and upsampling the equalization and, position filters to an original sampling frequency; and composing the upper equalization filters and the lower equalization filters to obtain a smooth link between low frequencies and high frequencies.

2. The sound system of claim 1, where the array of M loudspeakers comprises an array of multi-exciter distributed mode loudspeakers.

3. The sound system of claim 2, where the digital sound processor controls individual directional characteristics of the array of the multi-exciter.

4. The sound system of claim t further comprising a plurality of long finite impulse response filters connected to the N input sources, the long finite impulse response filters configured to change the sound effect of a reproduced sound in accordance with an original sound source.

5. The sound system of claim 4, where the long finite impulse response filters are set up independent of an arrangement of the array of M loudspeakers.

6. The sound system of claim 1, where the finite impulse response filters comprise short finite impulse response filters.

7. The sound system, of claim 6, where a set-up of the short finite impulse response filters depends on an arrangement of the array of M loudspeakers.

8. The sound system of claim 6, where the finite impulse response filters further comprise direct sound filters and plane wave filters.

9. A sound system, comprising:

a first sound arrangement for a first loudspeaker, the first sound arrangement comprising a first array of exciters arranged on a first panel; and a plurality of finite impulse response filters connected to the first array of exciters, the plurality of finite impulse response filters implemented by a digital signal processor;

where the finite impulse response configured by generating a first set of filter coefficients representative of a desired sound field at the location of the first loudspeaker by:

providing a microphone on a guide to measure output in an area that spans an entire listening zone to obtain a matrix of impulse responses for a plurality of microphone positions on the guide;

smoothing the measured data in a frequency domain by computing an excess phase model based upon each impulse response in each matrix of impulse responses for each microphone position and smoothing the excess phase model at high frequencies;

transforming the frequency of the microphone positions to the time domain to obtain a matrix of impulse responses for each of the microphone positions;

equalizing the system according to the desired sound field to obtain lower filters up to the aliasing frequency; and composing upper and lower filters from the matrix of impulse responses for each microphone position to obtain a smooth link between low frequencies and high frequencies.

10. The sound system of claim 9, further comprising:

a second sound arrangement for a second loudspeaker, which is different from the first sound arrangement, the second sound arrangement comprising a second array of exciters arranged on a second panel, where the second sound arrangement is also associated with the microphone when configuring the finite impulse response filters.

11. The sound system of claim 10, where a second set of filter coefficient representative of the desired sound field at the location of the second loudspeaker is generated during configuration of the finite impulse response filters.

12. The sound system of claim 9, where a multi-channel, iterative procedure is used to generate the first set of filter coefficient during the configuration of the finite impulse response filters.

13. The sound system of claim 10, where the microphone is removed from the sound system after the first and the second sets of filter coefficients are determined.

14. The sound system of claim 13, where configuration of the finite impulse response filters includes optimizing the first set of filter coefficients such that the desired sound field representative of the sound field produced by an original sound source is produced at the location of the first loudspeaker.

15. The sound system of claim 9, where the first array of exciters is equally spaced apart from each other.

16. The sound system of claim 10, where the first sound arrangement produces a first sound field of a sound source and the second sound arrangement produces a second sound field of the sound source, and the digital signal processor converges the first and the second sound fields to produce a synthesized sound source at an intended virtual sound source position.

17. The sound system of claim 9 where the digital sound processor performs the configuration of the finite impulse response filters.

18. The sound system of claim 9 where a second digital sound processor is added in a configuration system including the microphones to perform configuration of the finite impulse response filters, and removed when the configuration is complete.

19. The sound system of claim 9 where the microphone is moved to different microphone positions to obtain impulse responses at each of a selected set of microphone positions during the configuration of the finite impulse response filters.

20. The sound system of claim 9 where at least one other microphone is added during configuration of the finite impulse response filters to obtain at least one additional matrix of impulse responses for the microphone position of each at least one other microphone.

* * * * *

UNITED STATES PATENT AND TRADEMARK OFFICE

CERTIFICATE OF CORRECTION

PATENT NO. : 8,194,868 B2
APPLICATION NO. : 11/969149
DATED : June 5, 2012
INVENTOR(S) : Horbach et al.

It is certified that error appears in the above-identified patent and that said Letters Patent is hereby corrected as shown below:

In FIG. 1, the sound system should be labeled with reference numeral 100.

In FIG. 2, the sound system should be labeled with reference numeral 100.

In FIG. 2, the input currently labeled with reference numeral 142 should be labeled with reference numeral 115.

At column 4, line 60, "...wilt be..." should be changed to -- will be --.

At column 6, line 13, "...the microphones 700 are..." should be changed to -- the microphones 700 (FIG. 7) are --.

At column 7, line 28, " $e_n = [e^1(n)e^2(i) \ldots N_{mic}(n)]^t$ " should be changed to -- $e_n = [e^1(n)e^2(i) \ldots e^{N_{mic}}(n)]^t$ --.

At column 8, line 11, " ${DIFF_{or/smoo}}^{thre}$ " should be changed to -- $DIFF_{or/smoo}^{thre}$ --.

At column 8, lines 12–13, " ${DIFF_{or/smoo}}^{thre/smoo}$ " should be changed to -- $DIFF_{or/smoo}^{thre/smoo}$ --.

At column 8, line 15, " ${IMP_{dB}}^{smoo/thre}$ " should be changed to -- $IMP_{dB}^{smoo/thre}$ --.

At column 8, line 24, " ${IMP_{mp}}^{smoo}$ " should be changed to -- $IMP_{mp}^{smoo}$ --.

At column 8, line 36, " ${imp_{mp}}^{smoo}$ " should be changed to -- $imp_{mp}^{smoo}$ --.

At column 8, line 37, " ${imp_{mp/ex}}^{smoo}$ " should be changed to -- $imp_{mp/ex}^{smoo}$ --.

At column 8, line 38, " ${imp_{mp/ex}}^{smoo}$ " should be changed to -- $imp_{mp/ex}^{smoo}$ --.

At column 8, line 39, " ${f_{corn}}^{opt}$ " should be changed to -- $f_{corn}^{opt}$ --.

At column 8, line 43, " ${f_{corn}}^{opt}$ " should be changed to -- $f_{corn}^{opt}$ --.

At column 8, line 44, " ${imp_{mp/ex}}^{smoo}$ " should be changed to -- $imp_{mp/ex}^{smoo}$ --.

Signed and Sealed this
Twenty-ninth Day of January, 2013

David J. Kappos
*Director of the United States Patent and Trademark Office*

At column 10, line 16, "$h_{eqhf}{}^{i}(i = [1 \ldots Nls])$" should be changed to -- $h^{i}_{eqhf}(i = [1 \ldots Nls])$ --.

At column 10, lines 37–38, "...the microphone positions 500,..." should be changed to -- the microphone positions. --.

At column 11, line 21, "$\alpha = (I_{N_{mic}} + \xi_n{}^{t} * a_n)^{-1}$" should be changed to -- $\alpha = (I_{N_{mic}} + \xi^{t}_{n} * a_n)^{-1}$ --.

At column 11, line 23, "$q_n = P_{N-1} * \eta_{n-L_{filt}}$" should be changed to -- $q_n = P_{N-1} * \xi_{n-L_{filt}}$ --.

At column 11, line 24, "$b_n = q_n - \alpha * (a_n * \eta_{n-L_{filt}}) * a_n$" should be changed to -- $b_n = q_n - \alpha * (a_n * \xi_{n-L_{filt}}) * a_n$ --.

At column 11, line 26, "$\beta = (-I_{N_{mic}} + \eta_{n-L_{filt}}{}^{t} * b_n)^{-1}$" should be changed to -- $\beta = (-I_{N_{mic}} + \xi^{t}_{n-L_{filt}} * b_n)^{-1}$ --.

At column 11, line 28, "$P_n = P_{n-1} - \alpha * a_n * a_n{}^{t} - \beta * b_n * b_n{}^{t}$" should be changed to -- $P_n = P_{n-1} - \alpha * a_n * a^{t}_{n} - \beta * b_n * b^{t}_{n}$ --.

At column 11, line 31, "$r_n = r_{n-1} + \bar{\xi}_{n-1}{}^{t} * s_n - \bar{\xi}_{n-L_{filt}-1}{}^{t} * s_{n-L_{filt}}$' should be changed to -- $r_n = r_{n-1} + \bar{\xi}^{t}_{n-1} * s_n - \bar{\xi}^{t}_{n-L_{filt}-1} * s_{n-L_{filt}}$ --.

At column 11, line 33, "$e_n = d_n - w_{n-1}{}^{t} * s_n - \mu * \bar{\eta}_{n-1}{}^{t} * r_n$" should be changed to -- $e_n = d_n - w^{t}_{n-1} * s_n - \mu * \bar{\eta}^{t}_{n-1} * r_n$ --.

At column 12, line 36, "...exciters 1 to 21 are..." should be changed to -- exciters are --.

At column 12, line 37, "...to exciter 11 may..." should be changed to -- to one of the exciters --.

At column 12, line 40, "$d_{ref}{}^{multi}$" should be changed to -- $d^{multi}_{ref}$ --.

At column 12, line 42, "$d^{hf}_{i} = d^{the}_{i} - d_{ref}{}^{the} + d_{ref}{}^{multi}(i = [1 \ldots Nls])$" should be changed to -- $d^{hf}_{i} = d^{the}_{i} - d^{the}_{ref} + d^{multi}_{ref}(i = [1 \ldots Nls])$ --.

At column 15, line 41, claim 1, "...~put sources..." should be changed to -- input sources --.

At column 15, line 45, claim 1, "...filters, to..." should be changed to -- filters to --.

At column 16, line 4, Claim 4, "...of claim t..." should be changed to -- of claim 1 --.

At column 16, line 36, claim 9, "...the finite impulse response configured..." should be changed to -- the finite impulse response filters are configured --.

At column 16, line 48, claim 9, "...the frequency of the microphone..." should be changed to -- the frequency responses at each of the microphones --.

At column 16, line 54, claim 9, "...upper and lower filters..." should be changed to -- upper filters and lower filters --.